(12) United States Patent
Watanabe

(10) Patent No.: US 9,000,816 B2
(45) Date of Patent: *Apr. 7, 2015

(54) PHASE LOCKED LOOP AND SEMICONDUCTOR DEVICE USING THE SAME

(71) Applicant: Semiconductor Energy Laboratory Co., Ltd., Atsugi-shi, Kanagawa-ken (JP)

(72) Inventor: Kazunori Watanabe, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/276,256

(22) Filed: May 13, 2014

(65) Prior Publication Data

US 2014/0247093 A1 Sep. 4, 2014

Related U.S. Application Data

(63) Continuation of application No. 13/472,768, filed on May 16, 2012, now Pat. No. 8,729,938.

(30) Foreign Application Priority Data

May 20, 2011 (JP) ................................. 2011-113497

(51) Int. Cl.
*H03L 7/06* (2006.01)
*H03L 7/00* (2006.01)
*H03L 3/00* (2006.01)
*H03L 7/089* (2006.01)

(52) U.S. Cl.
CPC .. *H03L 7/00* (2013.01); *H03L 3/00* (2013.01); *H03L 7/0891* (2013.01)

(58) Field of Classification Search
None
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2226847 A    9/2010
(Continued)

OTHER PUBLICATIONS

Fukumoto.E et al., "High Mobility Oxide Semiconductor TFT for Circuit Integration of AM-OLED", IDW '10 : Proceedings of the 16th International Display Workshops, Dec. 1, 2010, pp. 631-634.
(Continued)

*Primary Examiner* — Cassandra Cox
(74) *Attorney, Agent, or Firm* — Eric J. Robinson; Robinson Intellectual Property Law Office, P.C.

(57) ABSTRACT

It is an object of the present invention to provide a phase locked loop in which a voltage signal input to a voltage controlled oscillator after a return from a stand-by state becomes constant in a short time and power consumption is reduced. A transistor including a semiconductor layer formed using an oxide semiconductor material is provided between an input terminal of a voltage controlled oscillator and a capacitor of a loop filter. The transistor is turned on in a normal operation state and turned off in a stand-by state.

18 Claims, 24 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,664,861 B2 | 12/2003 | Murakami |
| 6,727,522 B1 | 4/2004 | Kawasaki et al. |
| 6,777,991 B2 | 8/2004 | Murakami |
| 6,856,180 B1 | 2/2005 | Starr et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,973,608 B2 | 7/2011 | Kato et al. |
| 8,729,938 B2 * | 5/2014 | Watanabe .................. 327/156 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0246546 A1 | 10/2008 | Ha et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0114942 A1 | 5/2011 | Akimoto et al. |
| 2011/0115839 A1 | 5/2011 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-065525 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Fortunato.E.et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID Interntational Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment". Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Sympo-

(56) References Cited

OTHER PUBLICATIONS sium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 29, pp. 181-184.

Osada.T et al., "15.2 Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m±Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Sciences.

Coates.D et al., "Optical Studies of the Amorphous Liquid-Cholesteric Liquid Crystal Transition:the "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposoium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZNO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Paper, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDs", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1933.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Phyics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2006, pp. 581-584.

Kim.S et al., "High-Performance oxide thin film transistors passivated by various gas plasmas", 214th ECS Meeting, 2008, No. 2317, ECS.

Clark.S. et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

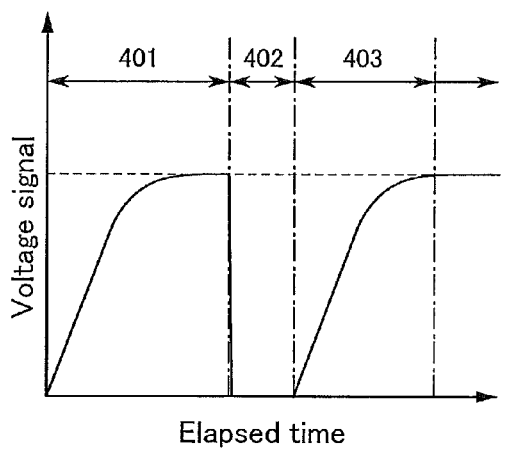
FIG. 4A1
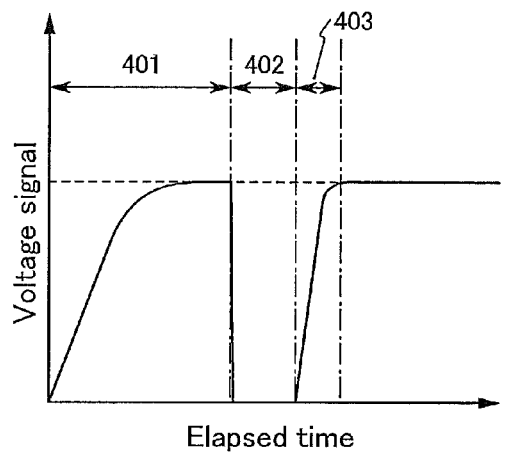
FIG. 4B1
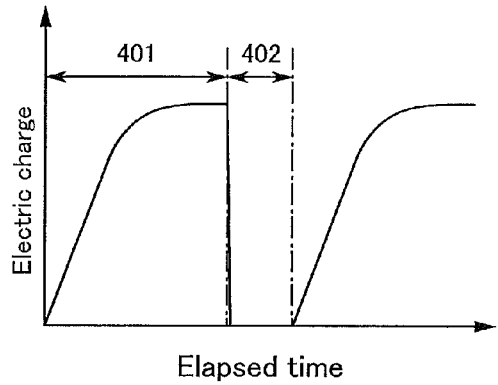
FIG. 4A2
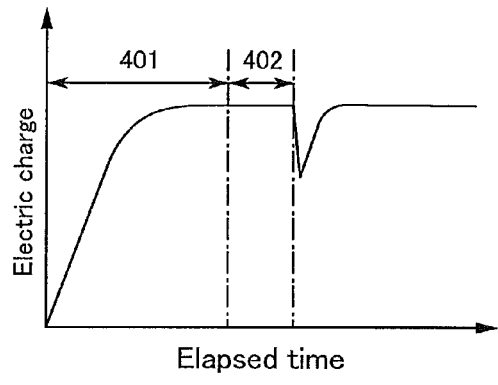
FIG. 4B2

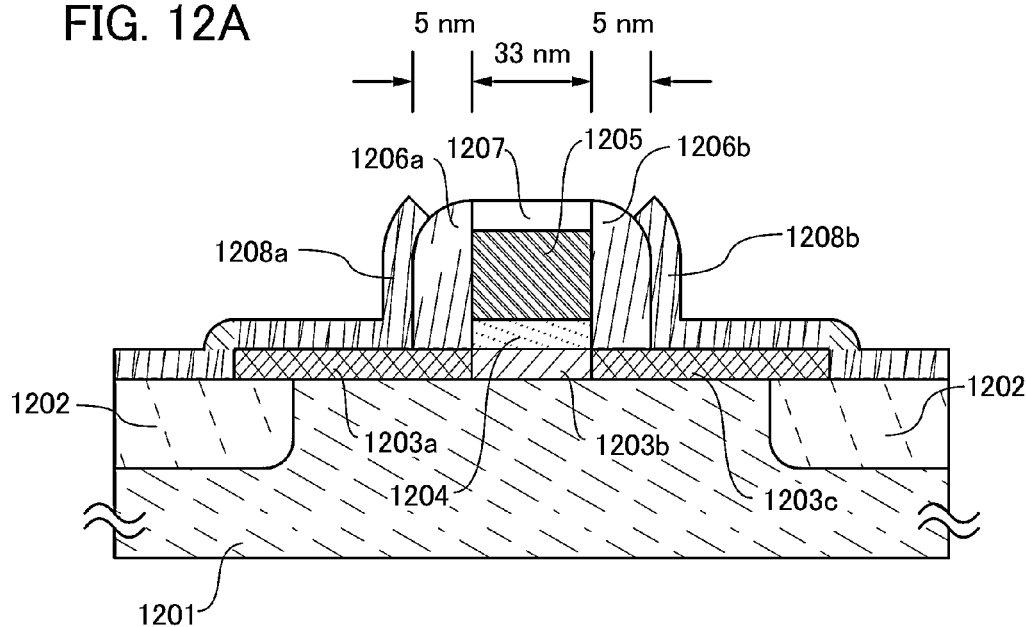
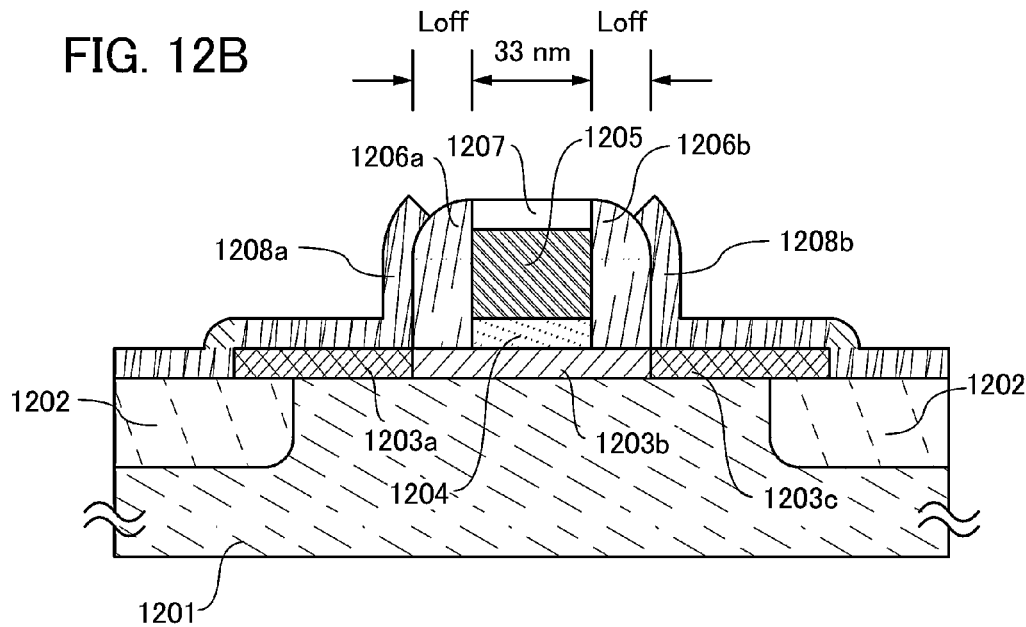

- In
- Sn
- Zn
- O

FIG. 22A
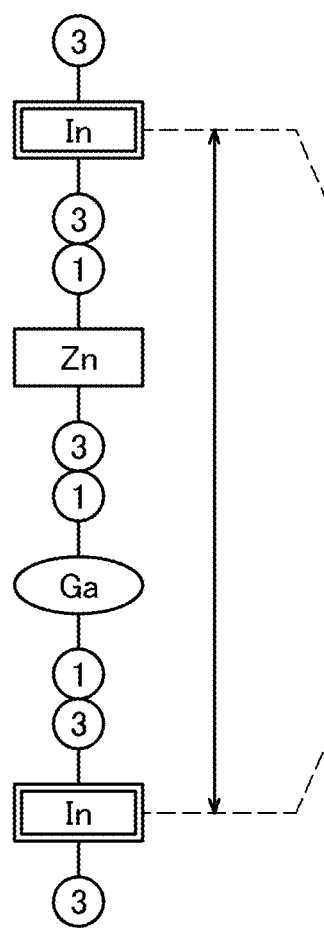
FIG. 22B
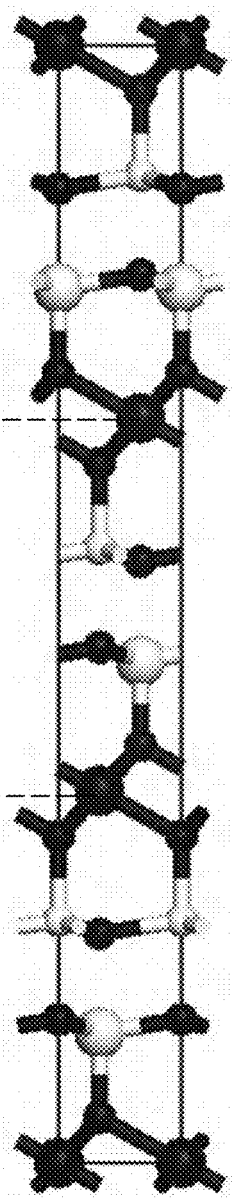
FIG. 22C
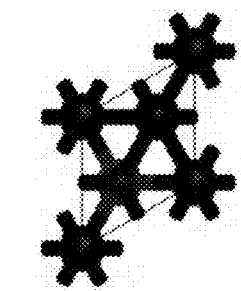
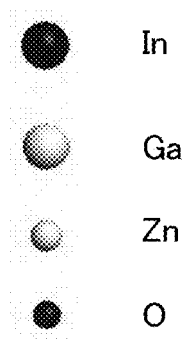
● In
● Ga
● Zn
● O

PHASE LOCKED LOOP AND SEMICONDUCTOR DEVICE USING THE SAME

BACKGROUND OF THE INVENTION

1. Field of the Invention

The present invention relates to a phase locked loop. The present invention relates to a semiconductor device including the phase locked loop.

2. Description of the Related Art

A phase locked loop (PLL) has functions of generating a periodic signal synchronized with a periodic signal input from the outside, and generating a periodic signal with cycles N times (N is a natural number) as much as a periodic signal input from the outside. Alternatively, the phase locked loop has a function of generating a stable periodic signal when a data signal which is similar to a periodic signal is input.

A basic configuration of a phase locked loop is disclosed in Patent Document 1.

REFERENCE

[Patent Document1] Japanese Published Patent Application No. H10-065525

SUMMARY OF THE INVENTION

An example of a configuration of a phase locked loop is illustrated in FIG. 3, in which a phase locked loop 100 includes a phase frequency detector (PFD) 102, a charge pump (CP) 104, a loop filter (LPF) 106, the voltage controlled oscillator (VCO) 108, and a frequency divider 110. Note that the loop filter 106 includes a capacitor 122.

To the phase frequency detector 102, two kinds of periodic signals are input: a periodic signal input from the outside and a periodic signal generated by dividing a signal output from the voltage controlled oscillator 108 by the frequency divider 110. Then, the phase frequency detector 102 outputs a signal based on the phase difference between the two periodic signals (hereinafter, also referred to as a phase difference signal).

The phase difference signal output from the phase frequency detector 102 is converted into a voltage signal by the charge pump 104 and the loop filter 106. The voltage signal is input to the voltage controlled oscillator 108.

The voltage controlled oscillator 108 outputs a periodic signal to the frequency divider 110 and the outside in response to the voltage signal input from the loop filter 106. The periodic signal is input from the frequency divider 110 to the phase frequency detector 102 again.

The phase locked loop 100 as a whole is a feedback control system. The above operations are continuously repeated, and when the phase difference between the periodic signal input from the outside to the phase frequency detector 102 and the periodic signal input from the frequency divider 110 to the phase frequency detector 102 becomes zero, the phase locked loop 100 is locked. That is, the voltage signal input to the voltage controlled oscillator 108 is constant (hereinafter, such a voltage signal is also referred to as a stable voltage), and thus, the cycle (frequency) of the periodic signal output from the voltage controlled oscillator 108 becomes constant.

When the phase difference signal output from the phase frequency detector 102 is converted into the voltage signal input to the voltage controlled oscillator 108, the stability and the response characteristics of the voltage signal greatly depend on the charge pump 104 and the loop filter 106. In addition, there is a trade-off between the stability and the response characteristics of the voltage signal.

FIGS. 2A and 2B each illustrate a relation between the stability and the response characteristics of the feedback control system. FIG. 2A shows an example of the case where "response characteristics are not preferable but stability is good". While the voltage signal is changed slowly, time until the voltage signal becomes stable is short. Hereinafter, the time is also referred to as stabilization time and corresponds to a stabilization time A in FIG. 2A. On the contrary, FIG. 2B shows an example of the case where "response characteristics are good but stability is not preferable". A voltage signal is changed quickly but the quickness is excessive and the voltage signal is oscillated; therefore, the stabilization time (corresponding to a stabilization time B in FIG. 2B) is long.

A phase locked loop ideally has both "high stability" as shown in FIG. 2A and "high response characteristics" as shown in FIG. 2B. However, as described above, there is a trade-off between the stability and the response characteristics of a voltage signal. Accordingly, any of phase locked loops needs stabilization time.

Note that "stable voltage signal" described above means not only that the voltage signal is completely constant, but also that the voltage signal fluctuates within the allowable range for operations of devices.

Many of integrated circuits today have a stand-by function (power-off function). In such a circuit, all of the operations of a phase locked loop are stopped and power consumption can be dramatically reduced. However, when the phase locked loop becomes a stand-by state, operations of a charge pump and a voltage controlled oscillator are also stopped; accordingly, the potential (electric charge) of a capacitor in a loop filter is lost. Therefore, after the phase locked loop is returned from the stand-by state, the following operation is needed: a voltage signal input to the voltage controlled oscillator by the charge pump and the loop filter is made to be a stable voltage again. This leads to a problem in that a time for the operation is required. Further, power is wasted before the voltage signal is becomes constant again.

In view of the above-described problems, the present invention is made. It is an object of the present invention to provide a phase locked loop in which a voltage signal input to a voltage controlled oscillator after the return from a stand-by state becomes constant in a short time and power consumption is reduced.

In order to solve the above problems, in the present invention, a transistor including an oxide semiconductor material in a semiconductor layer (at least in a channel formation region) is provided between an input terminal of an voltage controlled oscillator in a phase locked loop and a capacitor included in a loop filter. Hereinafter, the transistor also referred to as an OS (oxide semiconductor) transistor. An OS transistor is in an on state when the phase locked loop is in a normal operation. The OS transistor is in an off state when the phase locked loop is in a stand-by state.

Since the off-state current of an OS transistor can be sufficiently low, the potential (electric charge) of the capacitor can be held for a long time when an OS transistor is off.

Thus, the capacitor holds the potential (electric charge) corresponding to the state where the phase locked loop is in a locked state even when the phase locked loop is made to be in a stand-by state in the state where the phase locked loop is in the locked state (that is, the state where a voltage signal input to the voltage controlled oscillator is constant, and a cycle of a periodic signal output from the voltage controlled oscillator is constant) and operations of the charge pump and the voltage controlled oscillator are stopped.

Accordingly, when the phase locked loop is returned to a stand-by state, the potential (electric charge) of the capacitor is quickly input to the voltage controlled oscillator; thus, the phase locked loop is in the locked state in a short time.

That is, one embodiment of the present invention is a phase locked loop which is provided with a loop filter including a transistor and a capacitor. The transistor has a semiconductor layer including an oxide semiconductor material. The phase locked loop goes to a stand-by state after the transistor is turned off. The phase locked loop is returned from the stand-by state after the transistor is turned on.

Note that in the phase locked loop, the semiconductor layer may include one or more of elements selected from In, Ga, Sn, and Zn.

In one embodiment of the present invention, a phase locked loop includes a phase frequency detector to which a first periodic signal and a second periodic signal is input and which outputs a third periodic signal corresponding to a phase difference between the first periodic signal and the second periodic signal; a charge pump to which the third periodic signal is input and which outputs a first analog signal corresponding to the third periodic signal; a loop filter to which the first analog signal is input and which outputs a second analog signal formed by smoothing the first analog signal; a voltage controlled oscillator to which the second analog signal is input and which outputs a fourth periodic signal corresponding to the second analog signal; and a frequency divider to which the fourth periodic signal is input and which outputs the first periodic signal formed by dividing the fourth periodic signal. The loop filter comprises a transistor and a capacitor. A semiconductor layer of the transistor comprises an oxide semiconductor material. One of a source electrode and a drain electrode of the transistor is electrically connected to the charge pump and the voltage controlled oscillator and the other of the source electrode and the drain electrode of the transistor is electrically connected to the capacitor. The phase locked loop becomes a stand-by state after the transistor is turned off. The phase locked loop is returned from the stand-by state after the transistor is turned on.

Note that in the phase locked loop, the semiconductor layer may include one or more of elements selected from In, Ga, Sn, and Zn.

A phase locked loop can be provided which can be locked in a short time after a return from a stand-by state and in which power consumption is reduced.

Note that in this specification, an off-state current means a drain current flowing when a transistor is in an off state in a broad sense.

Further, an off state of a transistor means the state where a gate voltage is lower than a threshold voltage in an n-channel transistor, and a gate voltage is higher than a threshold voltage in a p-channel transistor.

A drain current means a current between a source and a drain of a transistor. A gate voltage means a voltage difference between a gate potential and a source potential which is used as a reference potential.

BRIEF DESCRIPTION OF THE DRAWINGS

FIGS. 4A1, 4A2, 4B1 and 4B2 show difference in change of a voltage signal between a general phase locked loop and a phase locked loop according to one embodiment of the present invention.

FIGS. 12A and 12B illustrate cross-sectional structures of transistors used for calculation.

FIGS. 22A to 22C illustrate a structure of an oxide material.

DETAILED DESCRIPTION OF THE INVENTION

Figure 1:
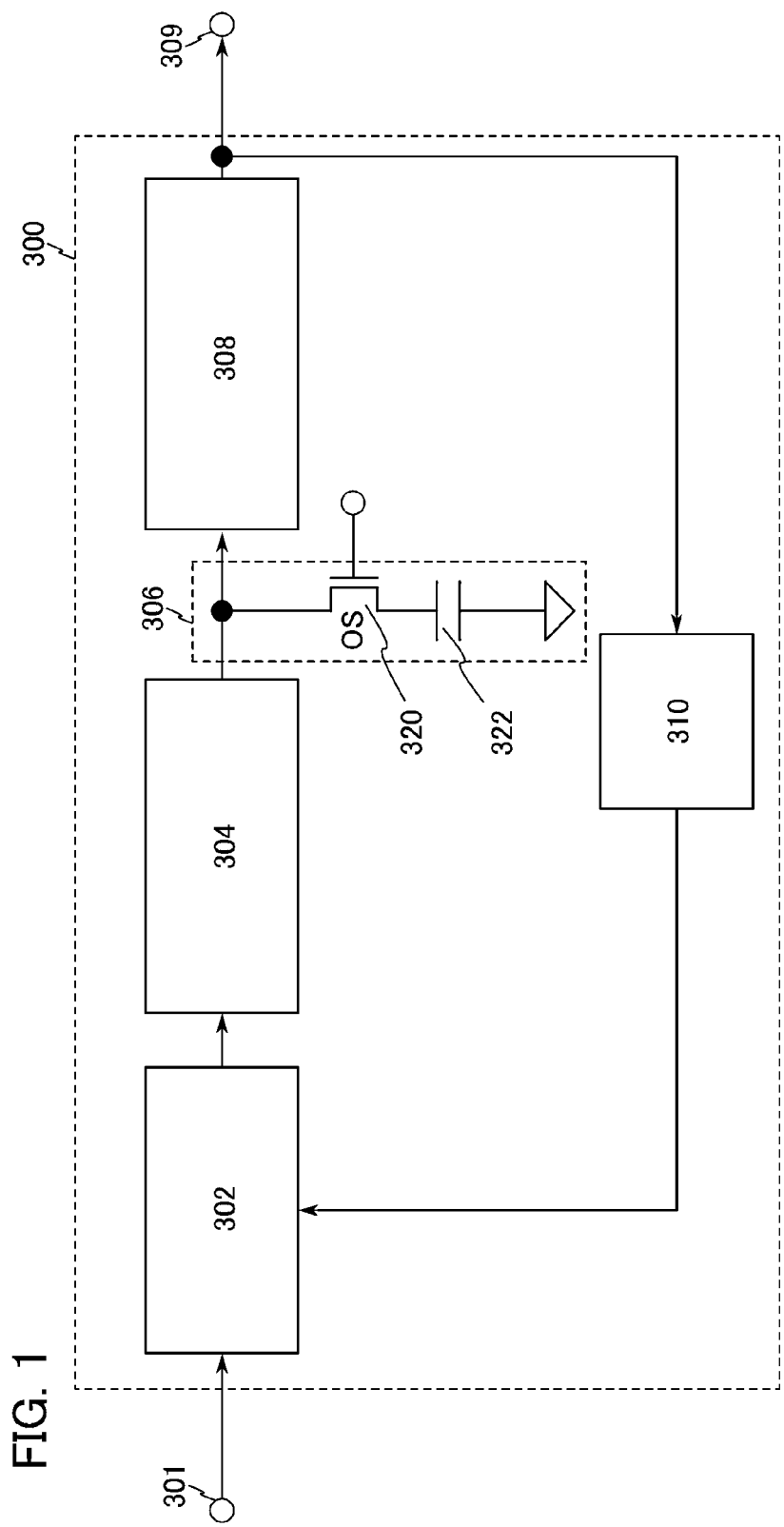
FIG. 1 illustrates a circuit configuration of a phase locked loop according to one embodiment of the present invention.

Hereinafter, embodiments of the disclosed invention are described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

Embodiment 1

In this embodiment, an example of a block diagram of a phase locked loop 300 according to one embodiment of the present invention is described with reference to FIG. 1. Further, a method for driving the phase locked loop 300 is described while attention is paid to a loop filter 306 showing a unique effect.

Example of Block Diagram of Phase Locked Loop According to this Embodiment

The phase locked loop 300 described in this embodiment includes a phase frequency detector 302, a charge pump 304, the loop filter 306, a voltage controlled oscillator 308, and a frequency divider 310. The loop filter 306 includes a transistor 320 and a capacitor 322.

To the phase frequency detector 302, a periodic signal is input from an input terminal 301 and a periodic signal divided by the frequency divider 310 after it is output from the voltage controlled oscillator 308 is input. The phase frequency detector 302 has a function of outputting a periodic signal (a phase difference signal) determined by a phase difference between the two signals to the charge pump 304. Note that in the case where the phase locked loop 300 is in the locked state (i.e., a voltage signal input to the voltage controlled oscillator 308 is constant and the cycle of a periodic signal output from the voltage controlled oscillator 308 is constant), there is no phase difference between the two periodic signals input to the phase frequency detector 302; accordingly, a periodic signal is not output from the phase frequency detector 302.

The charge pump 304 has functions of converting the phase difference signal input from the phase frequency detector 302 into a current signal and outputting the current signal to the loop filter 306.

The loop filter 306 has functions of converting the current signal output from the charge pump 304 into a voltage signal and outputting the converted voltage signal to the voltage controlled oscillator 308.

The converted voltage V can be expressed by the following formula assuming that the current signal input to the loop filter 306 is i and the capacitance of the capacitor 322 is C.

$$V = \frac{1}{C}\int i\,dt \quad \text{[FORMULA 1]}$$

The loop filter 306 has a function of integrating an original signal, i.e., smoothing a signal component changing at very close intervals (a high-frequency component) by using filtering. This function is important in terms of a stable control operation. Increase of C degrades response characteristics and improves stability.

Further, the loop filter 306 has the OS transistor 320 including an oxide semiconductor material in a semiconductor layer (at least in a channel formation region) between the capacitor 322 and an input terminal of the voltage controlled oscillator 308. In order to differentiate the transistor from a normal transistor, "OS" is written beside a symbol of a transistor in the drawing. The OS transistor 320 is in an on state when the phase locked loop 300 is in a normal operation state, and the OS transistor 320 is turned off just before the phase locked loop 300 is made to be in a stand-by state. Because the OS transistor 320 has a very low off-state current, even after the phase locked loop 300 is made to be in a stand-by state, the capacitor 322 hold a potential (electric charge) at the time of turning off the OS transistor 320 for a long time. Further, the OS transistor 320 is turned on just before the phase locked loop 300 is returned from a stand-by state. The potential (electric charge) of the OS transistor 320 in an off state which is held in the capacitor 322 is supplied to the voltage controlled oscillator 308 soon; accordingly, time for making the voltage signal input to the voltage controlled oscillator 308 returned to a stable voltage can be short. Note that a method for manufacturing the OS transistor 320 is described in Embodiment 2 in detail.

Note that charge and discharge of the capacitor 322 are repeated in accordance with the level of a current signal output from the charge pump 304 until the phase locked loop 300 is locked, and the voltage signal becomes stable when the phase locked loop 300 is locked. In recent years, the phase locked loop 300 is used a lot for applications requiring high-speed switching of frequencies (e.g., a local area wireless network, a mobile phone, and terrestrial digital broadcasting); accordingly, the loop filter 306 needs very high response characteristics (very quick response). Thus, the OS transistor provided between the voltage controlled oscillator 308 and the capacitor 322 needs very high response characteristics (very quick response), that is, high mobility. A transistor including an oxide semiconductor material in a semiconductor layer (at least in a channel formation region), which is described in this specification, has characteristics which are sufficient for being used for the above application requiring high mobility. The characteristics of the OS transistor 320 are described in detail in Embodiments 2 and 3.

The voltage controlled oscillator 308 has a function of outputting a periodic signal in accordance with the voltage signal input from the loop filter 306 to an output terminal 309 and the frequency divider 310.

The frequency divider 310 has functions of dividing the periodic signal input from the voltage controlled oscillator 308 and outputting the divided signal to the phase frequency detector 302.

The above is a description of an example of the block diagram of the phase locked loop 300 in this embodiment.

Method for Driving Phase Locked Loop in this Embodiment

A method for driving the phase locked loop 300 in this embodiment is basically similar to the above method for driving a general phase locked loop. However, by the use of the OS transistor 320 in the loop filter 306 as in this embodiment, a unique effect is observed in change in voltage signal output from the loop filter 306 at the time when the phase locked loop 300 is returned from a stand-by state.

Described below with reference to FIGS. 4A1, 4A2, 4B1, and 4B2 is, at the time of when a periodic signal with a desired cycle (frequency) is obtained from the output terminal 309 and then the phase locked loop 300 is brought into a stand-by state, how change in voltage signal output from the loop filter 306 in the phase locked loop 300 in this embodiment is different from change in voltage signal of the general phase locked loop 100 in a period in which after a predetermined time, the phase locked loop 300 is returned from the stand-by state, and a periodic signal with a desired cycle (frequency) is obtained again from the output terminal 309.

The following description is given on the assumption that the phase frequency detectors 102 and 302 have the same function, the charge pumps 104 and 304 have the same function, the loop filters 106 and 306 have the same function, the voltage controlled oscillators 108 and 308 have the same function, the frequency dividers 110 and 310 have the same function, and the capacitors 122 and 322 have the same function.

Figure 2A:
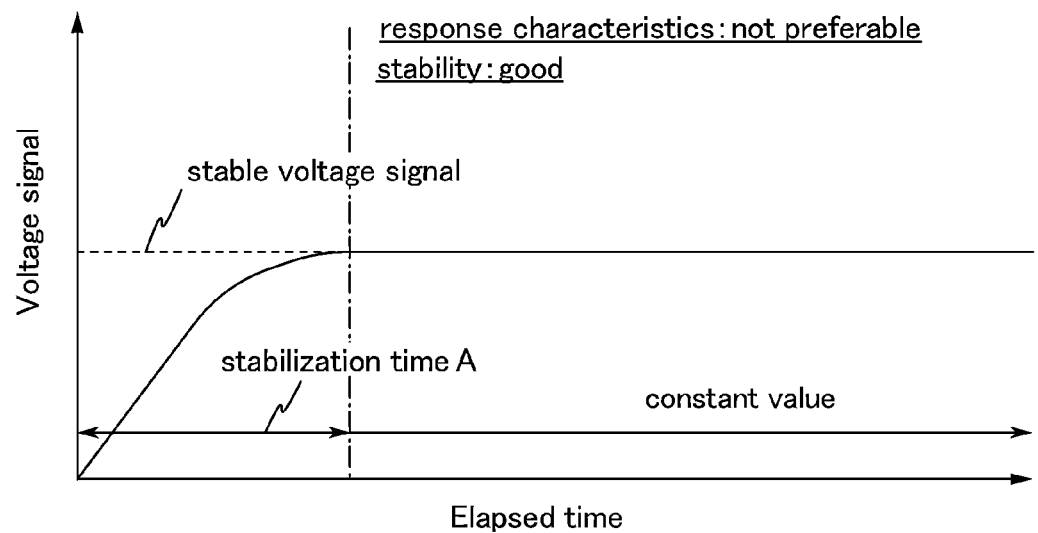
FIGS. 2A and 2B each illustrate a relation between stability and a response characteristic of a voltage signal.
Figure 2B:
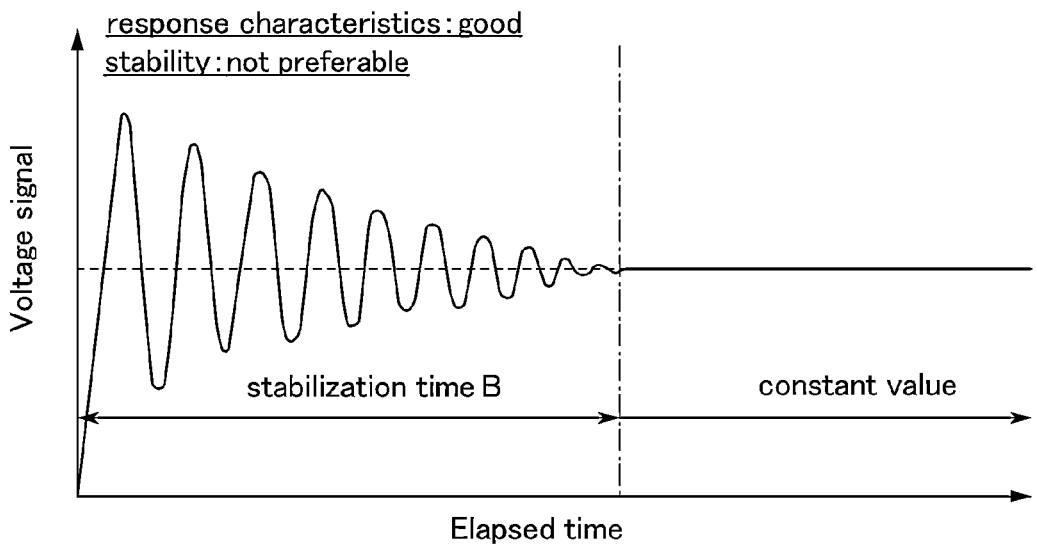
Figure 3:
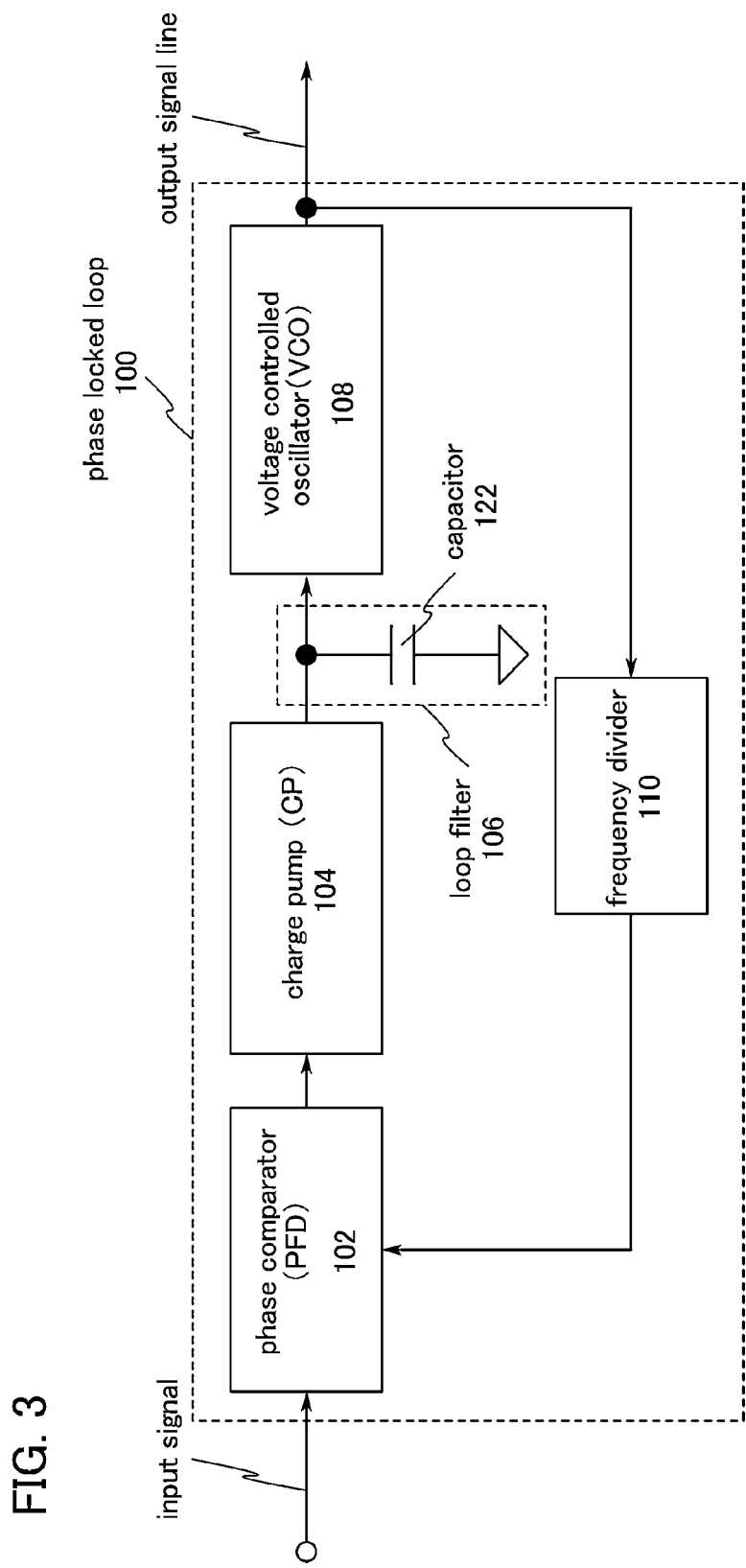
FIG. 3 illustrates an example of a circuit configuration of a phase locked loop.

FIGS. 4A1 and 4A2 show schematic graphs: FIG. 4A1 showing change in voltage signal output from the loop filter 106 in the general phase locked loop 100 and FIG. 4A2 showing change in electric charge of the capacitor 122 in the phase locked loop 100. FIGS. 4B1 and 4B2 show schematic graphs: FIG. 4B1 showing change in voltage signal output from the loop filter 306 in the phase locked loop 300 and FIG. 4B2 showing change in electric charge of the capacitor 322 in the phase locked loop 300.

First, the OS transistor 320 in the phase locked loop 300 is on in a normal operation state and does not affect change in output voltage in a period in which the phase locked loop starts to operate and a voltage signal output from the loop filter becomes stable, and then, the phase locked loop is brought into a stand-by state (corresponding to a period 401 in FIGS. 4A1 and 4A2 and FIGS. 4B1 and 4B2). Therefore, an output voltage from the loop filter 106 and an output voltage from the loop filter 306 are similarly changed.

Next, in a period in which the phase locked loop is brought into a stand-by state and then returned after a predetermined time (corresponding to a period 402 in FIGS. 4A1 and 4A2 and FIGS. 4B1 and 4B2), the output voltage from the loop filter 106 and the output voltage from the loop filter 306 are similarly changed as in the period 401. However, in comparison with the electric charge in the capacitor 322, the electric charge in the capacitor 122 is rapidly discharged at the time of becoming a stand-by state and becomes 0 in a short time (see FIG. 4A2). On the other hand, the capacitor 322 can hold the electric charge just before a stand-by state. This is because the OS transistor 320 is provided between the input terminal of the voltage controlled oscillator 308 and the capacitor 322, and the transistor is turned off just before the stand-by state (see FIG. 4B2).

When the phase locked loop is returned from a stand-by state, the phase locked loop 100 needs recharging of the capacitor 122 and therefore needs time (corresponding to a period 403 in FIG. 4A1) until a voltage signal is stabilized. In contrast, the phase locked loop 300 enables a voltage signal to be stabilized in shorter time (corresponding to a period 403 in FIG. 4B1) than the phase locked loop 100 because the phase locked loop 300 holds the electric charge just before a stand-by state in the capacitor 322 and the potential (electric charge) held in the capacitor 322 is input to the voltage controlled oscillator 308 as soon as the phase locked loop 300 is returned. That is, the phase locked loop 300 can be in the locked state in short time after a return from the stand-by state. Thus, power consumed until the phase locked loop is in the locked state so as not to control the subsequent operation can be saved; therefore, power consumption of the phase locked loop can be reduced.

The above is a description of the method for driving the phase locked loop in this embodiment.

The OS the transistor 320 is provided between the input terminal of the voltage controlled oscillator 308 and the capacitor 322 in the loop filter 306, and the OS transistor 320 is in an on state in a normal operation state and the OS transistor 320 is in an off state in a stand-by state. In this manner, the phase locked loop 300 can be in the locked state in short time after the return from a stand-by state and further power consumption can be reduced.

Embodiment 2

In this embodiment, a structural example and an example of a method for manufacturing a transistor and including an oxide semiconductor material in a semiconductor layer (at least in a channel formation region) described in the above embodiment are explained with reference to FIGS. 5A and 5B, FIGS. 6A to 6E, and FIGS. 7A to 7C. The characteristics of the transistor are also described.

Structure of OS Transistor in this Embodiment

Figure 5A:
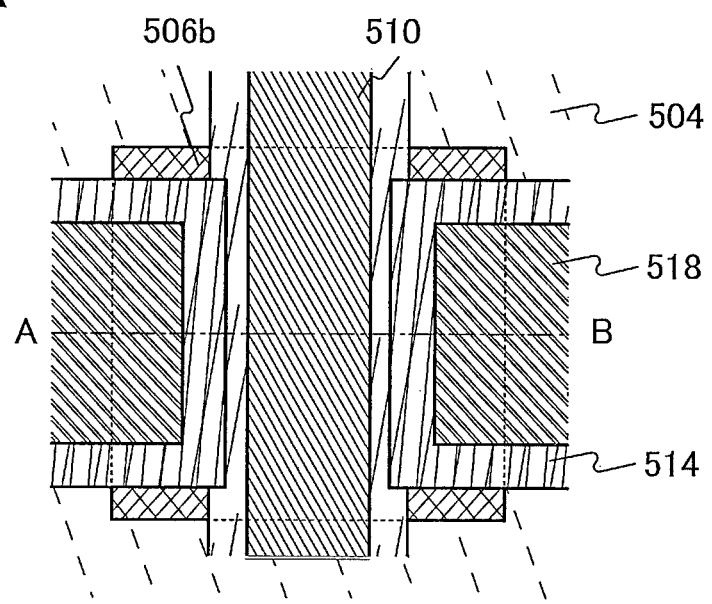
FIGS. 5A and 5B are a top view and a cross-sectional view of an OS transistor according to one embodiment of the present invention.
Figure 5B:
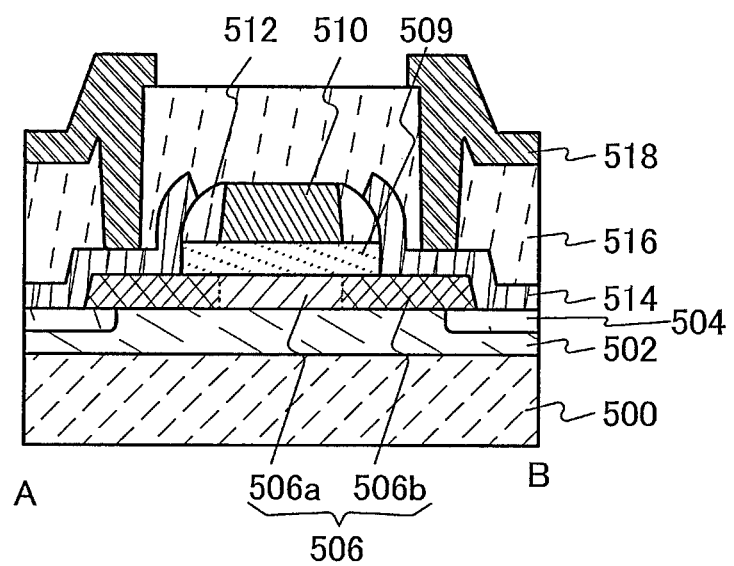

FIGS. 5A and 5B are a top view and a cross-sectional view of a coplanar transistor having a top-gate top-contact structure. FIG. 5A is the top view of the transistor and FIG. 5B is a cross-sectional view taken along a dashed-dotted line A-B in FIG. 5A. Note that FIG. 5A does not show part of components for easy understanding.

A transistor illustrated in FIG. 5B includes a substrate 500, a base insulating layer 502 provided over the substrate 500, a protective insulating layer 504 provided over the base insulating layer 502, an oxide semiconductor layer 506 which includes a high-resistance region 506a (also referred to as "intrinsic semiconductor region") and low-resistance regions 506b (also referred to as "semiconductor region") and which is provided over the base insulating layer 502 and the protective insulating layer 504, a gate insulating layer 509 provided over the oxide semiconductor layer 506, a gate electrode 510 provided to overlap with the high-resistance region 506a with the gate insulating layer 509 provided therebetween, sidewall insulating layers 512 which are in contact with the sidewalls of the gate electrode 510, and the pair of electrodes 514 which are at least in contact with the low-resistance regions 506b and the sidewall insulating layers 512. Note that the protective insulating layer 504 preferably overlaps with an end portion of the oxide semiconductor layer 506 and is in contact with the pair of electrodes 514. The transistor may include an interlayer insulating layer 516 which is provide so as to cover the transistor, and wirings 518 connected to the pair of electrodes 514 through openings provided in the interlayer insulating layer 516.

In the transistor illustrated in FIG. 5B, the low-resistance regions 506b of the oxide semiconductor layer 506 can be formed in a self-aligned manner with the use of the gate electrode 510 as a mask. Accordingly, a photolithography process for the low-resistance regions 506b (and the high-resistance region 506a which is formed at the same time as the low-resistance regions 506b) can be omitted. Further, since there is substantially no overlap between the low-resistance region 506b and the gate electrode 510, parasitic capacitance due to an overlap among the low-resistance region 506b, the gate insulating layer 509, and the gate electrode 510 is not generated, so that the transistor can operate at high speed.

Note that a channel region is formed in the high-resistance region 506a when voltage higher than or equal to the threshold voltage of the transistor is applied between the gate electrode 510 and a source electrode.

The transistor illustrated in FIG. 5B includes the sidewall insulating layers 512; accordingly, when the transistor operates, an electric field is applied from the pair of electrodes 514 to the high-resistance region 506a through the low-resistance regions 506b. The low-resistance regions 506b relax the concentration of an electric field on the high-resistance region 506a, so that deterioration such as hot carrier degradation can be prevented even in a minute transistor with a short channel length, which can make the transistor highly reliable.

Method for Manufacturing an OS Transistor in this Embodiment

Figure 6A:
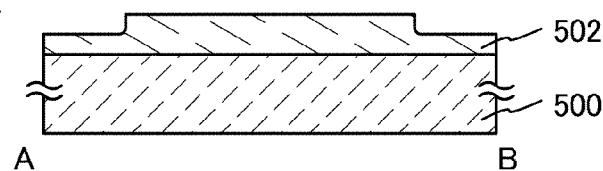
FIGS. 6A to 6E are cross-sectional views illustrating a method for manufacturing an OS transistor according to one embodiment of the present invention.

First, the base insulating layer 502 is formed over the substrate 500 (FIG. 6A).

The substrate 500 can be a glass substrate (e.g., a barium borosilicate glass substrate and an aluminoborosilicate glass substrate), a substrate formed of an insulator (e.g., a ceramic substrate, a quartz substrate, and a sapphire substrate), a crystallized glass substrate, a plastic substrate, a semiconductor substrate (e.g., a silicon substrate), or the like, for example. Note that in the case where the substrate 500 is a highly flexible substrate such as a plastic substrate, a method also can be used by which a circuit including the transistor described in this embodiment is formed over a substrate with low flexibility such as a glass substrate with a separation layer provided therebetween and then is separated from the substrate with low flexibility such as a glass substrate and is transferred to a flexible substrate.

A method for forming the base insulating layer 502 is as follows. First, a base insulating film is formed over the substrate 500 by a physical vapor deposition (PVD) method such as an electron-beam evaporation method or a sputtering method, and a chemical vapor deposition (CVD) method such as a thermal CVD method or a plasma CVD method. Next, a resist formed in a pattern in which the base insulating film is to be processed is formed over the base insulating film by a well-known method such as a photolithography method or an inkjet method. Unnecessary part of the base insulating film is selectively removed by a well-known method such as a dry etching method or a wet etching method. In this manner, the base insulating layer 502 is formed.

A base insulating film used for forming the base insulating layer 502 is formed by at least one of silicon oxide, silicon nitride, silicon oxynitride, silicon nitride oxide, aluminum oxide, aluminum nitride, aluminum oxynitride, aluminum nitride oxide, hafnium oxide, zirconium oxide, yttrium oxide, lanthanum oxide, cesium oxide, tantalum oxide, and magnesium oxide.

Note that the base insulating layer 502 may have a single-layer structure or a stacked-layer structure. In the case of a stacked-layer structure, the above films may be combined to form the base insulating layer 502. There is no particular limitation on the thickness of the base insulating layer 502; for example, the base insulating layer 502 preferably has a thickness of greater than or equal to 10 nm and less than or equal to 500 nm. When the thickness is less than 10 nm, the base insulating layer 502 might not be formed in some regions because of thickness distribution within a substrate surface due to a deposition apparatus. In addition, when the thickness is greater than 500 nm, deposition time and manufacturing cost might be increased.

For the base insulating layer 502, an insulating film from which oxygen is released by heat treatment is preferably used. When an insulating film releasing oxygen by heat treatment is used as a film which is to be in contact with the oxide semiconductor layer 506 in a later step, oxygen is supplied from the base insulating layer 502 to the oxide semiconductor layer 506, so that oxygen deficiency in the oxide semiconductor layer 506 and in the vicinity of an interface between the oxide semiconductor layer 506 and the gate insulating layer 509 can be compensated. Consequently, electrical characteristics of the transistor are prevented from deteriorating.

To release oxygen by heat treatment means that the released amount of oxygen which is converted to oxygen atoms is greater than or equal to $1.0 \times 10^{18}/cm^3$, preferably greater than or equal to $3.0 \times 10^{20}/cm^3$ in thermal desorption spectroscopy (TDS).

Figure 6B:
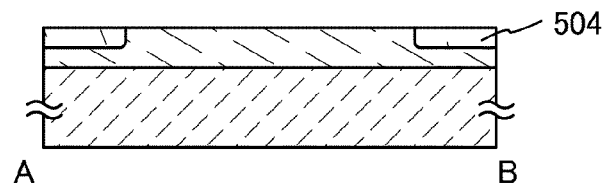

Next, the protective insulating layer 504 having the same level of the base insulating layer 502 is formed (see FIG. 6B).

A method for forming the protective insulating layer 504 is as follows. First, a protective insulating film serving as the protective insulating layer 504 is formed over the base insulating layer 502 by a physical vapor deposition (PVD) method such as an electron-beam evaporation method or a sputtering method, a chemical vapor deposition (CVD) method such as a thermal CVD method or a plasma CVD method, or the like. Then, the protective insulating film is polished to be leveled with the base insulating layer 502 by chemical mechanical polishing (CMP) treatment. In this manner, the protective insulating layer 504 is formed. Note that the surfaces of the base insulating layer 502 and the protective insulating layer 504 may be at substantially the same level. The difference in level on the surfaces is preferably 3 nm or less, more preferably 1 nm or less, still preferably 0.5 nm or less.

Note that in order to increase the planarity of the surface of the oxide semiconductor layer 506 formed in a later step, the surfaces of the base insulating layer 502 and the protective insulating layer 504 are preferably planarized as much as possible. Specifically, the average surface roughness ($R_a$) is preferably 1 nm or less, more preferably 0.3 nm or less.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$R_a = \frac{1}{S_0} \int_{y1}^{y2} \int_{x1}^{x2} |f(x, y) - Z_0| \, dx \, dy \qquad \text{[FORMULA 2]}$$

In the above formula, $S_0$ represents an area of a plane to be measured (a quadrilateral region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

The protective insulating layer 504 may be formed using at least one of silicon nitride, silicon nitride oxide, aluminum nitride, hafnium oxide, zirconium oxide, yttrium oxide, lanthanum oxide, cesium oxide, tantalum oxide, and magnesium oxide.

In the case of a stacked-layer structure, the above films may be combined to form the protective insulating layer 504. The thickness of the protective insulating layer 504 is not limited, but it is preferable that the surface of the protective insulating layer 504 be approximately level with the surface of the base insulating layer 502 as described above.

It is preferable that the protective insulating layer 504 be a film through which oxygen does not pass even when heat treatment at a temperature higher than or equal to 250° C. and lower than or equal to 450° C., preferably higher than or equal to 150° C. and lower than or equal to 800° C. is performed for one hour, for example.

Since the protective insulating layer 504 has the above characteristics, the structure in which the protective insulating layer 504 is provided over the base insulating layer 502 so as to overlap with the end portion of the oxide semiconductor layer 506 does not allow oxygen to be released by heating treatment from the base insulating layer 502 to the outside of the transistor; accordingly, oxygen can be efficiently supplied to the oxide semiconductor layer 506 to be formed later. In this manner, the electrical characteristics and reliability of the transistor can be improved.

Note that the protective insulating layer 504 is provided in this embodiment, but it is not necessarily provided. Whether or not to provide the protective insulating layer 504 may be determined as appropriate, in consideration of requisite characteristics of a transistor and the like.

Figure 6C:
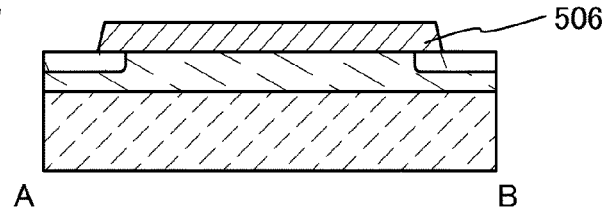

Next, the oxide semiconductor layer 506 is formed over the base insulating layer 502 and the protective insulating layer 504 (see FIG. 6C).

A method for forming the oxide semiconductor layer 506 is as follows. First, an oxide semiconductor film is formed over the base insulating layer 502 and the protective insulating layer 504 by a sputtering method, an evaporation method, a PCVD method, a PLD method, an ALD method, an MBE method, or the like. Next, a resist formed in a pattern in which the oxide semiconductor film is to be processed is formed over the oxide semiconductor film by a well-known method such as a photolithography method or an inkjet method. Unnecessary part of the oxide semiconductor film is selectively removed by a well-known method such as a dry etching method or a wet etching method. In this manner, the oxide semiconductor layer 506 is formed.

The oxide semiconductor layer is in a single crystal state, a polycrystalline (also referred to as polycrystal) state, an amorphous state, or the like.

The oxide semiconductor layer is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is prevented.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With use of the CAAC-OS film in a transistor, change in electric characteristics of the transistor due to irradiation with visible light or ultraviolet light can be reduced. Thus, the transistor has high reliability.

The oxide semiconductor layer 506 is formed preferably by a sputtering method in an oxygen gas atmosphere at a substrate heating temperature of 100° C. to 600° C. inclusive, preferably 150° C. to 550° C. inclusive, and further preferably 200° C. to 500° C. inclusive. This is because a sputtering method hardly allows entry of impurities such as hydrogen, water, a hydroxyl group, and hydride. The thickness of the oxide semiconductor layer is more than or equal to 1 nm and less than or equal to 40 nm, and preferably more than or equal to 3 nm and less than or equal to 20 nm. As the substrate heating temperature at the time of deposition is higher, the impurity concentration of the obtained oxide semiconductor layer is lower. Further, the atomic arrangement in the oxide semiconductor film is ordered, the density thereof is increased, so that a film with crystallinity such as a polycrystal film or a CAAC-OS film is readily formed. Furthermore, since an oxygen gas atmosphere is employed for the deposition, an unnecessary atom is not contained in the oxide semiconductor layer 506 unlike in the case of employing a rare gas atmosphere or the like, so that a film with crystallinity such as a polycrystal film or a CAAC-OS film is readily formed. Note that a mixed gas atmosphere including an oxygen gas and a rare gas may be used. In that case, the percentage of an oxygen gas is higher than or equal to 30 vol.%, preferably higher than or equal to 50 vol.%, more preferably higher than or equal to 80 vol.%. Note that as the oxide semiconductor layer is thinner, a short-channel effect of a transistor is reduced. However, when the oxide semiconductor layer is too thin, the oxide semiconductor layer is significantly influenced by interface scattering; thus, the field effect mobility might be decreased.

Note that in the case where the oxide semiconductor film is etched by dry etching, as an etching gas used for dry etching of the oxide semiconductor film, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. Wet etching can be conducted, for example, using ITO07N (product of Kanto Chemical Co., Inc.).

An oxide semiconductor to be used for the oxide semiconductor layer 506 preferably contains at least indium (In) or zinc (Zn). In particular, In and Zn are preferably contained. As a stabilizer for reducing variation in electrical characteristics of a transistor using an oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

For example, an In—Ga—Zn-based oxide with an atomic ratio of In:Ga:Zn=1:1:1 (=$1/3$:$1/3$:$1/3$) or In:Ga:Zn=2:2:1 (=$2/5$:$2/5$:$1/5$), or any of oxides whose composition is in the neighborhood of the above compositions can be used. Alternatively, an In—Sn—Zn-based oxide with an atomic ratio of In:Sn:Zn=1:1:1 (=$1/3$:$1/3$:$1/3$), In:Sn:Zn=2:1:3 (=$1/3$:$1/6$:$1/2$), or In:Sn:Zn=2:1:5 (=$1/4$:$1/8$:$5/8$), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

In the case of forming a film of an In—Ga—Zn—O-based material as the oxide semiconductor film by a sputtering method, it is preferable to use an In—Ga—Zn—O target having the following atomic ratio: the atomic ratio of In:Ga:Zn is 1:1:1, 4:2:3, 3:1:2, 1:1:2, 2:1:3, or 3:1:4. When an oxide semiconductor film is formed using an In—Ga—Zn—O target having the aforementioned atomic ratio, a polycrystal film or a CAAC-OS film is easily formed.

In the case of forming a film of an In—Sn—Zn—O-based material as an oxide semiconductor film by a sputtering method, it is preferable to use an In—Sn—Zn—O target having an atomic ratio of In:Sn:Zn=1:1:1, 2:1:3, 1:2:2, or 20:45:35. When an oxide semiconductor film is formed using an In—Sn—Zn—O target having the aforementioned atomic ratio, a polycrystal film or a CAAC-OS film is easily formed.

The relative density of the metal oxide in the target is 80% or more, preferably 95% or more, and more preferably 99.9% or more. The use of a target with high relative density makes it possible to form an oxide semiconductor film with a dense structure.

It has been reported that the use of an amorphous In—Sn—Zn— based oxide achieves high mobility (Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED", IDW'10, pp. 631-634). However, it is possible to obtain high mobility even with an In—Ga—Zn-based oxide by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2=r^2$, and r may be 0.05, for example.

Note that when a transistor including an oxide semiconductor material including In, Sn, or Zn as a main component in a semiconductor layer (at least in a channel formation region) is manufactured, a substrate is intentionally heated during formation of a film and/or heat treatment is performed after formation of the film, whereby characteristics of a transistor can be improved. The content is described in Embodiment 3 in detail.

The oxide semiconductor layer 506 formed using the above oxide semiconductor may be either single crystal or non-single-crystal. In the latter case, the non-single-crystal oxide semiconductor may be amorphous, microcrystalline (nanocrystalline), or polycrystalline. Further, the oxide semiconductor may have either an amorphous structure including a portion having crystallinity or a non-amorphous structure.

The CAAC-OS film is preferably used as the oxide semiconductor layer 506. Note that the CAAC-OS film is described in Embodiment 4 in detail.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced, and mobility higher than that of an amorphous oxide semiconductor can be obtained by increasing the surface planarity. Therefore, as described above, the surface of the base insulating layer 502 and the surface of the protective insulating layer 504 are preferably flat as much as possible.

In forming the oxide semiconductor film by a sputtering method, for example, an object to be processed is held in a treatment chamber that is maintained under reduced pressure, and the object to be processed is heated to a temperature higher than or equal to 100° C. and lower than or equal to 600° C., preferably, higher than or equal to 150° C. and lower than or equal to 550° C., more preferably higher than or equal to 200° C. and lower than or equal to 500° C. Alternatively, the temperature of an object to be processed in forming the oxide semiconductor film may be room temperature. Then, moisture in the treatment chamber is removed, a sputtering gas from which moisture, hydrogen, nitrogen, or the like is removed is introduced, and the above-described target is used; thus, the oxide semiconductor film is formed. By forming the oxide semiconductor film while the object to be processed is heated, an impurity in the oxide semiconductor film, such as hydrogen or water, can be reduced. Therefore, it is possible that the field-effect mobility of the transistor is improved. Moreover, damage due to sputtering can be reduced. In order to remove moisture in the treatment chamber, an entrapment vacuum pump is preferably used. For example, a cryopump, an ion pump, a titanium sublimation pump, or the like is preferably used. Alternatively, a turbo pump provided with a cold trap can be also used. Since it is possible to remove impurity such as moisture from the treatment chamber by evacuating the treatment chamber with a cryopump or the like, the concentration of an impurity in the oxide semiconductor film can be reduced.

In the case where the oxide semiconductor film is formed by a sputtering method, for example, the following conditions can be set: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because particles (such as powder substances generated in deposition) can be reduced and the film thickness can be uniform. The thickness of the oxide semiconductor film is preferably greater than or equal to 1 nm and less than or equal to 50 nm, preferably greater than or equal to 1 nm and less than or equal to 30 nm, more preferably greater than or equal to 1 nm and less than or equal to 10 nm. This is because a short-channel effect due to miniaturization can be prevented when the oxide semiconductor film having such a thickness is used for the oxide semiconductor layer 506. An appropriate thickness differs depending on the oxide semiconductor material to be used, the usage, or the like; thus, the thickness may be determined as appropriate in accordance with the material, the usage of a semiconductor device, or the like.

Note that before the oxide semiconductor film is formed by a sputtering method, dust attached to a surface on which the oxide semiconductor film is to be formed is preferably removed by reverse sputtering in which an argon gas is introduced and plasma is generated. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

Even when the oxide semiconductor film is formed by the method described above, the oxide semiconductor film contains moisture or hydrogen (including a hydroxyl group) as an impurity in some cases. Moisture or hydrogen easily forms donor levels and thus serves as an impurity in the oxide semiconductor. In order to reduce impurities such as moisture and hydrogen in the oxide semiconductor film (dehydrate or dehydrogenate the oxide semiconductor film), the oxide semiconductor film may be subjected to heat treatment for dehydration or dehydrogenation (hereinafter abbreviated to first heat treatment) in a reduced-pressure atmosphere, an inert gas atmosphere such as a nitrogen atmosphere or a rare gas atmosphere, an oxygen gas atmosphere, or the like.

By performing the first heat treatment on the oxide semiconductor film, moisture or hydrogen at the surface of the oxide semiconductor film and in the s oxide semiconductor film can be released. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes, inclusive. When an RTA method is used for the heat treatment, dehydration or dehydrogenation can be performed in a short time; therefore, treatment can be performed even at a temperature higher than the strain point of a glass substrate.

The heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

The first heat treatment is performed in a reduced-pressure atmosphere or an inert gas atmosphere such as a nitrogen atmosphere, a helium atmosphere, a neon atmosphere, or an argon atmosphere. Note that it is preferable that the above atmosphere do not contain moisture, hydrogen, and the like. The purity of nitrogen, or a rare gas such as helium, neon, or argon which is introduced into a heat treatment apparatus is set to 6N (99.9999%) or higher, preferably 7N (99.99999%) or higher (that is, the impurity concentration is 1 ppm or lower, preferably 0.1 ppm or lower).

Further, a second heat treatment may be performed on the oxide semiconductor film which has been subjected to the first heat treatment. By performing the second heat treatment in an oxidation atmosphere, oxygen is supplied to the oxide semiconductor layer; oxygen deficiency caused in the oxide semiconductor film by the first heat treatment is accordingly compensated. Thus, the second heat treatment may be referred to as an oxygen supplying treatment. The second heat treatment may be performed at a temperature of higher than or equal to 200° C. and lower than the strain point of the substrate, and is preferably performed at a temperature of higher than or equal to 250° C. and lower than or equal to 450° C. The treatment time is 3 minutes to 24 hours. As the treatment time is increased, the proportion of a crystal region with respect to that of an amorphous region in the oxide semiconductor layer 506 can be increased. Note that heat treatment for longer than 24 hours is not preferable because the productivity is low.

The oxidizing atmosphere is an atmosphere containing an oxidizing gas. Oxidation gas is oxygen, ozone, nitrous oxide, or the like, and it is preferable that the oxidation gas do not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is lower than 1 ppm, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen supply be successively performed. When the first heat treatment and the second heat treatment are successively performed, the productivity of a semiconductor device can be increased.

By performing heat treatment in addition to the substrate heating at the time of deposition on the oxide semiconductor film, the impurity level in the film can be significantly reduced. Accordingly, the field-effect mobility of the transistor can be increased so as to be close to ideal field-effect mobility to be described later.

The first heat treatment and the second heat treatment are performed on an oxide semiconductor film in the above description. Note that the first heat treatment and the second heat treatment may be performed after the formation of the oxide semiconductor layer 506.

Further, after the formation of the semiconductor film or/and after the formation of the oxide semiconductor layer 506, oxygen adding treatment may be first performed on the oxide semiconductor layer 506 (or the oxide semiconductor film), and then the heat treatment may be performed to eliminate hydrogen, a hydroxyl group, or moisture contained in the oxide semiconductor and simultaneously to allow the oxide semiconductor to be crystallized. The crystallization may be performed in an additional heat treatment performed later. Through such crystallization or recrystallization process, the crystallinity of the oxide semiconductor layer 506 (or the oxide semiconductor film) can be further improved.

Here, the "oxygen adding treatment" means that oxygen (which includes at least one of an oxygen radical, an oxygen atom, and an oxygen ion) is added to a bulk of the oxide semiconductor layer 506 (or the oxide semiconductor film). Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. When oxygen adding treatment is performed, the amount of oxygen contained in the oxide semiconductor layer 506 can be made larger than that in the stoichiometric ratio. Further, after the formation of the gate insulating layer 509 (or an insulating film used for forming the gate insulating layer 509) in a subsequent step, the gate insulating layer 509 (or the insulating film used for forming the gate insulating layer 509) may be subjected to oxygen adding treatment, whereby the amount of oxygen in the gate insulating layer 509 (or the insulating film used for forming the gate insulating layer 509) can be made larger than that in the stoichiometric ratio.

The oxygen adding treatment is preferably performed by an inductively coupled plasma (ICP) method, using oxygen plasma excited by microwaves (with a frequency of 2.45 GHz, for example).

Note that the oxygen adding treatment can also be referred to as treatment for supplying oxygen because it is performed so that the amount of oxygen in the oxide semiconductor film (the oxide semiconductor layer 506), the insulating film (or the gate insulating layer 509), or the like is larger than that in the stoichiometric ratio. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

Figure 6D:
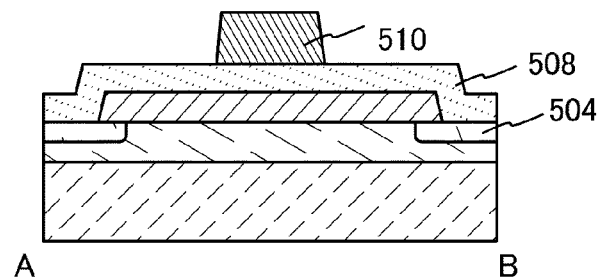
Figure 6E:
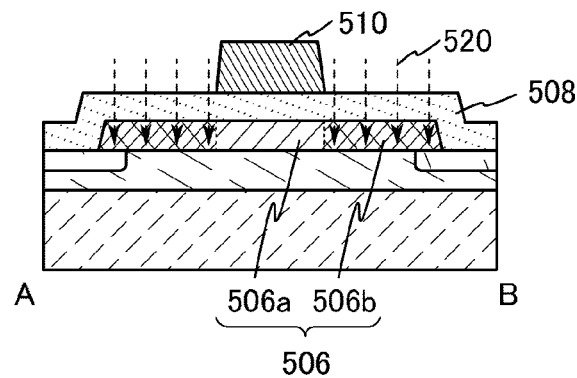

Then, an insulating layer 508 is formed over the protective insulating layer 504 and the oxide semiconductor layer 506, and the gate electrode 510 is formed over the insulating layer 508 to overlap with the oxide semiconductor layer 506 (see FIG. 6D).

The insulating layer 508 may be formed using the method and the material similar to those of the base insulating layer 502.

A method for forming the gate electrode 510 is as follows. First, a conductive film is formed over the insulating layer 508 by a physical vapor deposition (PVD) method such as an electron-beam evaporation method or a sputtering method, and then unnecessary part of the conductive film is selectively removed as in the case of the base insulating layer 502. In this manner, the gate electrode 510 is formed.

The conductive film used for forming the gate electrode 510 may be formed to have a single-layer structure or a stacked-layer structure using one or more kinds of aluminum, titanium, chromium, cobalt, nickel, copper, yttrium, zirconium, molybdenum, silver, tantalum, and tungsten, a nitride of any of these elements, an oxide of any of these elements, and an alloy of any of these elements. Alternatively, a material similar to that of the oxide semiconductor layer 506 may be used.

Next, an impurity element 520 for reducing the resistance of the oxide semiconductor layer 506 is added to the oxide semiconductor layer 506 through the insulating layer 508 by using the gate electrode 510 as a mask. The high-resistance region 506a and the low-resistance regions 506b are formed in the oxide semiconductor layer 506 in a self-aligned manner (see FIG. 6E).

The impurity element 520 for reducing the resistance of the oxide semiconductor layer 506 can be an element such as phosphorus, nitrogen, boron, or the like. The element can be added to the oxide semiconductor layer 506 by an ion implantation method, an ion doping method, or the like. Since it is preferable to prevent hydrogen from being added to the oxide semiconductor layer 506 as much as possible, an ion implantation method by which mass spectrometry of the added element is performed is preferably used.

The impurity element 520 is added through the insulating layer 508, so that damage in the oxide semiconductor layer 506 caused when the impurity element 520 is added can be reduced.

Figure 7A:
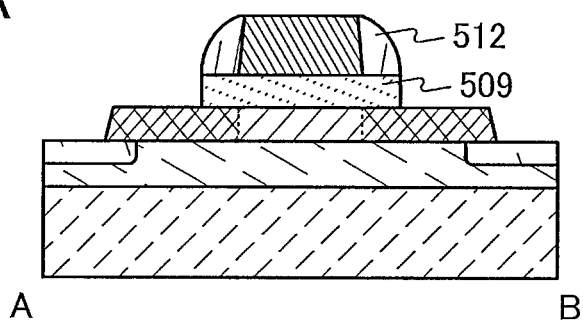
FIGS. 7A to 7C are cross-sectional views illustrating a method for manufacturing an OS transistor according to one embodiment of the present invention.
Figure 7B:
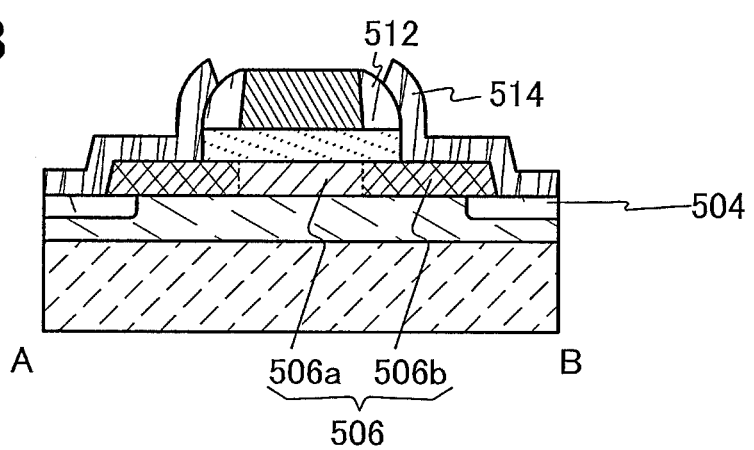
Figure 7C:
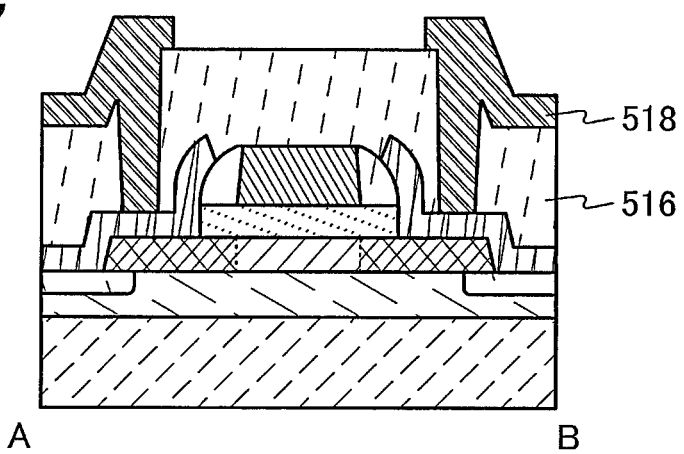

Then, the sidewall insulating layers 512 are formed over the insulating layer 508 so as to be in contact with the sidewalls of the gate electrode 510, and the insulating layer 508 is processed by using the sidewall insulating layers 512 as masks to form the gate insulating layer 509 (see FIG. 7A).

A method for forming the sidewall insulating layers 512 is as follows. First, a base insulating film is formed over the insulating layer 508 and the gate electrode 510 by a physical vapor deposition (PVD) method such as an electron-beam evaporation method or a sputtering method, and a chemical vapor deposition (CVD) method such as a thermal CVD method or a plasma CVD method. Next, a resist formed in a pattern in which the insulating film is to be processed is formed over the insulating film by a well-known method such as a photolithography method or an inkjet method. Unnecessary part of the insulating film is selectively removed by a well-known method such as a dry etching method or a wet etching method. In this manner, the sidewall insulating layers 512 are formed. After the formation of the sidewall insulating layers 512, the insulating layer 508 is etched by using the sidewall insulating layers 512 as masks, so that the gate insulating layer 509 can be formed.

Note that the etching method is preferably highly anisotropic etching because the sidewall insulating layers 512 can be formed in a self-aligned manner. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas. A rare gas such as helium (He) or argon (Ar) or hydrogen ($H_2$) may be added to the etching gas. Furthermore, as dry etching, a reactive ion etching method (an RIE method) in which a high-frequency voltage is applied to a substrate is preferably used.

An insulating film used for forming the sidewall insulating layers 512 may be a film similar to the base insulating film used for forming the base insulating layer 502.

Then, a conductive film is formed by a physical vapor deposition (PVD) method such as an electron-beam evaporation method or a sputtering method, and a chemical vapor deposition (CVD) method such as a plasma CVD method. Next, a resist formed in a pattern in which the conductive film is to be processed is formed over the conductive film by a well-known method such as a photolithography method or an inkjet method. Unnecessary part of the conductive film is selectively removed by a well-known method such as a dry etching method or a wet etching method. In this manner, the pair of electrodes 514 are formed (see FIG. 7B).

Then, an interlayer insulating layer 516 is formed by a physical vapor deposition (PVD) method such as an electron-beam evaporation method or a sputtering method, and a chemical vapor deposition (CVD) method such as a plasma CVD method. Next, a resist formed in a pattern in which the interlayer insulating layer 516 is to be processed is formed over the interlayer insulating layer 516 by a well-known method such as a photolithography method or an inkjet method. After openings are formed in parts of the interlayer insulating layer 516 by a well-known method such as a dry etching method or a wet etching method, a wiring 518 electrically connected to the pair of electrodes 514 is formed in the manner similar to the gate electrode 510 (see FIG. 7C).

Through the above steps, a transistor (an OS transistor) having the structure illustrated in FIG. 5B can be manufactured. The transistor includes an oxide semiconductor material in a semiconductor layer (at least in a channel formation region) and can have a sufficiently low off-state current. Further, the transistor can have high mobility (see Embodiment 2 and Embodiment 3 for detail description of the mobility).

The actually measured field-effect mobility of an insulated gate transistor can be lower than its original mobility because of a variety of reasons; this phenomenon occurs not only in the case of a transistor including an oxide semiconductor material in a semiconductor layer (at least in a channel formation region). One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \quad \text{[FORMULA 3]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 4]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region is expressed by the following formula.

$$I_d = \frac{W \mu V_g V_d C_{ox}}{L} \exp\left(-\frac{E}{kT}\right) \quad \text{[FORMULA 5]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) = \quad \text{[FORMULA 6]}$$
$$\ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g}$$

The right side of Formula 6 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. For example, the defect density N of an oxide semiconductor in which the ratio of indium (In), tin (Sn), and zinc (Zn) is 1:1:1 is about $1 \times 10^{12}/\text{cm}^2$.

On the basis of the defect density obtained in this manner, or the like, $\mu_0$ can be calculated to be 120 cm$^2$/Vs from Formula 3 and Formula 4. The measured mobility of a transistor that uses an In—Sn—Zn oxide including a defect is approximately 30 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right) \quad \text{[FORMULA 7]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 7 is increased and accordingly the mobility $\mu_1$ is decreased.

Figure 8:
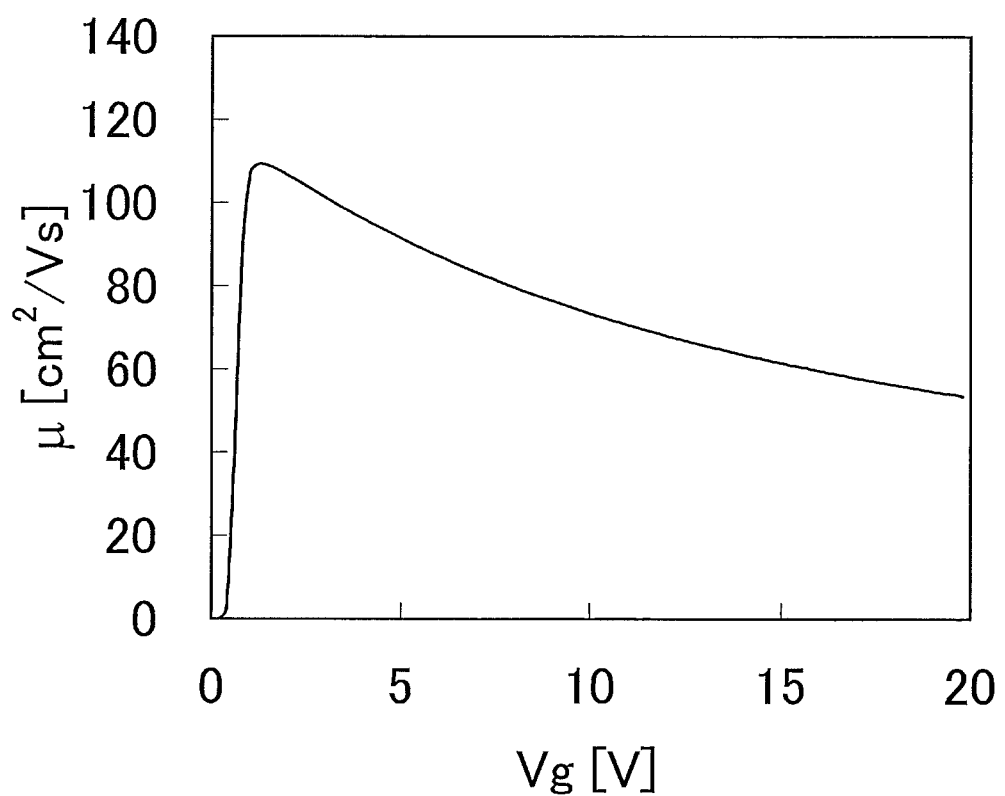
FIG. 8 shows gate voltage dependence of mobility obtained by calculation.

Calculation results of the mobility $\mu_2$ of a transistor whose channel includes an ideal oxide semiconductor without a defect inside the semiconductor are shown in FIG. 8. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 8, the mobility has a peak of more than 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 9A to 9C, FIGS. 10A to 10C, and FIGS. 11A to 11C. FIGS. 12A and 12B illustrate cross-sectional structures of the transistors used for the calculation. The transistors illustrated in FIGS. 12A and 12B each include a semiconductor region 1203a and a semiconductor region 1203c which have n$^+$-type conductivity in an oxide semiconductor layer. The resistivities of the semiconductor region 1203a and the semiconductor region 1203c are $2 \times 10^{-3}$ Ωcm.

The transistor illustrated in FIG. 12A is formed over a base insulating layer 1201 and an protective insulating layer 1202 which is embedded in the base insulating layer 1201 and formed of aluminum oxide. The transistor includes the semiconductor region 1203a, the semiconductor region 1203c, an intrinsic semiconductor region 1203b serving as a channel formation region therebetween, and a gate electrode 1205. The width of the gate electrode 1205 is 33 nm.

A gate insulating layer 1204 is formed between the gate electrode 1205 and the semiconductor region 1203b. In addition, a sidewall insulating layer 1206a and a sidewall insulating layer 1206b are formed on both sidewalls of the gate electrode 1205, and an insulating layer 1207 is formed over the gate electrode 1205 so as to prevent a short circuit between the gate electrode 1205 and another wiring. The sidewall insulator has a width of 5 nm. A source electrode 1208a and a drain electrode 1208b are provided in contact with the semiconductor region 1203a and the semiconductor region 1203c, respectively. Note that the channel width of this transistor is 40 nm.

The transistor of FIG. 12B is the same as the transistor of FIG. 12A in that it is formed over the base insulating layer 1201 and the protective insulating layer 1202 formed of aluminum oxide and that it includes the semiconductor region 1203a, the semiconductor region 1203c, the intrinsic semiconductor region 1203b provided therebetween, the gate electrode 1205 having a width of 33 nm, the gate insulating layer 1204, the sidewall insulating layer 1206a, the sidewall insulating layer 1206b, the insulating layer 1207, the source electrode 1208a, and the drain electrode 1208b.

The transistor illustrated in FIG. 12A is different from the transistor illustrated in FIG. 12B in the conductivity type of semiconductor regions under the sidewall insulating layer 1206a and the sidewall insulating layer 1206b. In the transistor illustrated in FIG. 12A, the semiconductor regions under the sidewall insulating layer 1206a and the sidewall insulating layer 1206b are part of the semiconductor region 1203a having n$^+$-type conductivity and part of the semiconductor region 1203c having n$^+$-type conductivity, whereas in the transistor illustrated in FIG. 12B, the semiconductor regions under the sidewall insulating layer 1206a and the sidewall insulating layer 1206b are part of the intrinsic semiconductor region 1203b. In other words, in the transistor illustrated in FIG. 12B, a region having a width of $L_{off}$ which overlaps with neither the semiconductor region 1203a (the semiconductor region 1203c) nor the gate electrode 1205 is provided. This region is called an offset region, and the width $L_{off}$ is called an offset length. As is seen from the drawing, the offset length is equal to the width of the sidewall insulating layer 1206a (the sidewall insulating layer 1206b).

Figure 9A:
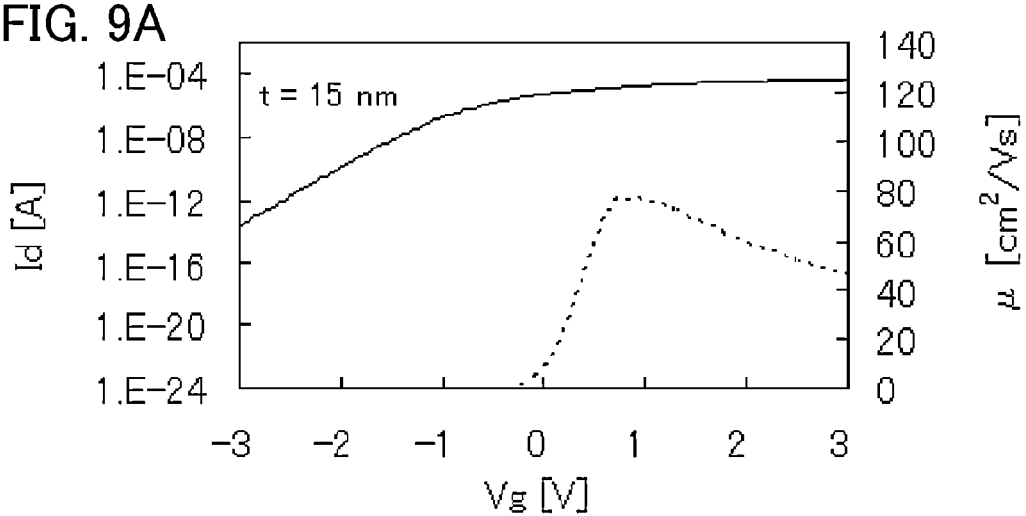
FIGS. 9A to 9C show gate voltage dependence of a drain current and mobility obtained by calculation.
Figure 9B:
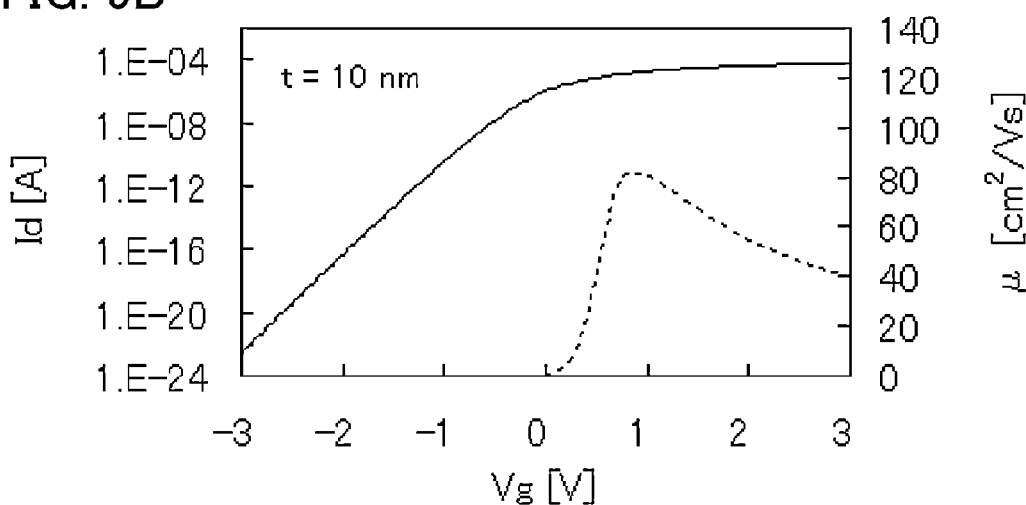
Figure 9C:
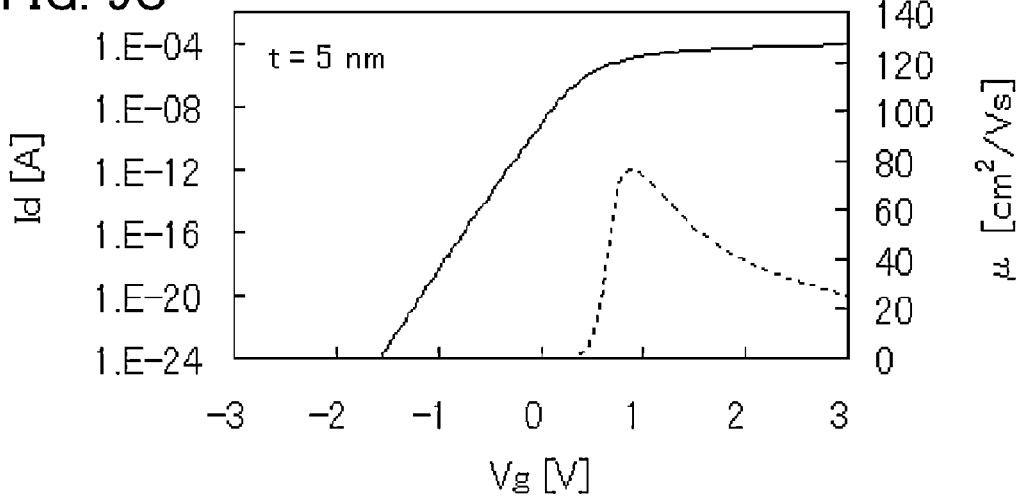

The other parameters used in calculation are as described above. For the calculation, device simulation software Sentaurus Device manufactured by Synopsys, Inc. was used. FIGS. 9A to 9C show the gate voltage ($V_g$: a potential difference between the gate and the source) dependence of the drain current ($I_d$, a solid line) and the mobility (μ, a dotted line) of the transistor having the structure illustrated in FIG. 12A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 9A shows the gate voltage dependence of the transistor in the case where the thickness of the gate insulating layer is 15 nm, FIG. 9B shows that of the transistor in the case where the thickness of the gate insulating layer is 10 nm, and FIG. 9C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ (on-state current) in an on state. Further, the graphs show that in either of the structures, the drain current exceeds 10 μA, which is required in a memory element and the like, at a gate voltage of around 1 V.

Figure 10A:
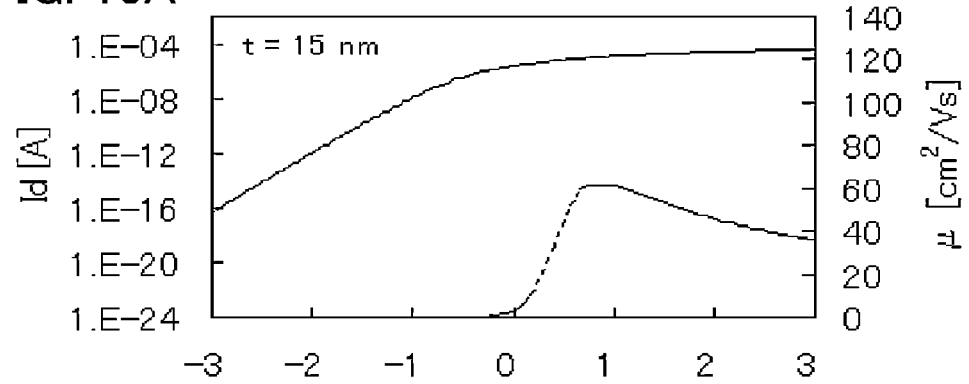
FIGS. 10A to 10C show gate voltage dependence of a drain current and mobility obtained by calculation.
Figure 10B:
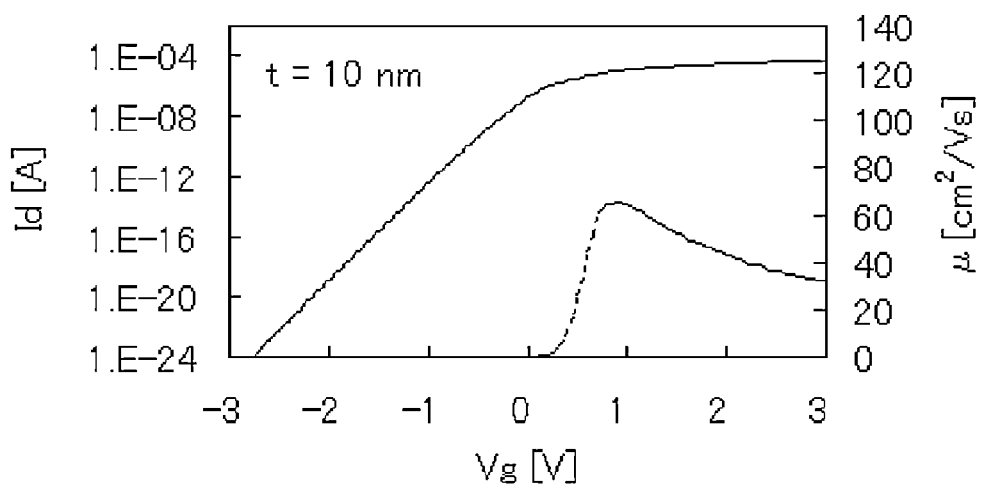
Figure 10C:
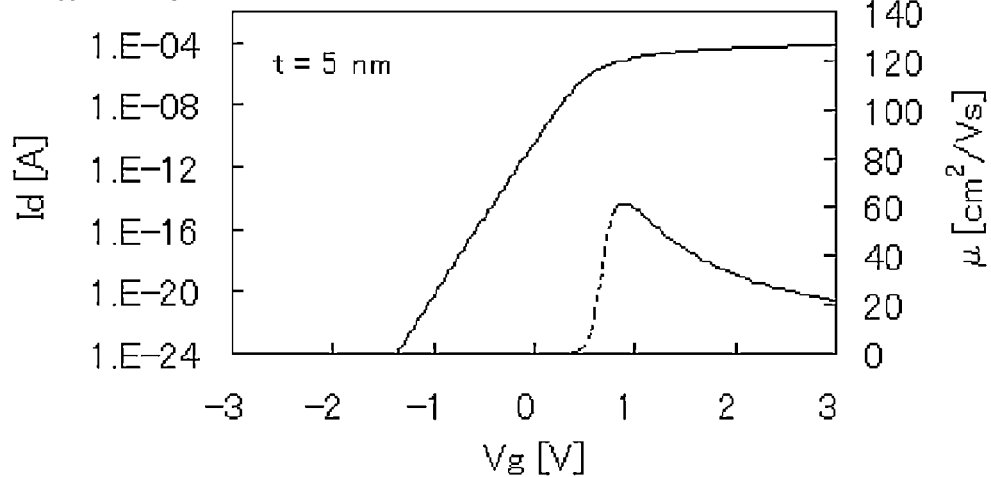

FIGS. 10A to 10C show the gate voltage $V_g$ dependence of the drain current $I_d$ (a solid line) and the mobility μ (a dotted line) of the transistor having the structure illustrated in FIG. 12B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 10A shows the gate voltage dependence of the transistor in the case where the thickness of the gate insulating layer is 15 nm, FIG. 10B shows that of the transistor in the case where the thickness of the gate insulating layer is 10 nm, and FIG. 10C shows that of the transistor in the case where the thickness of the gate insulating layer is 5 nm.

Figure 11A:
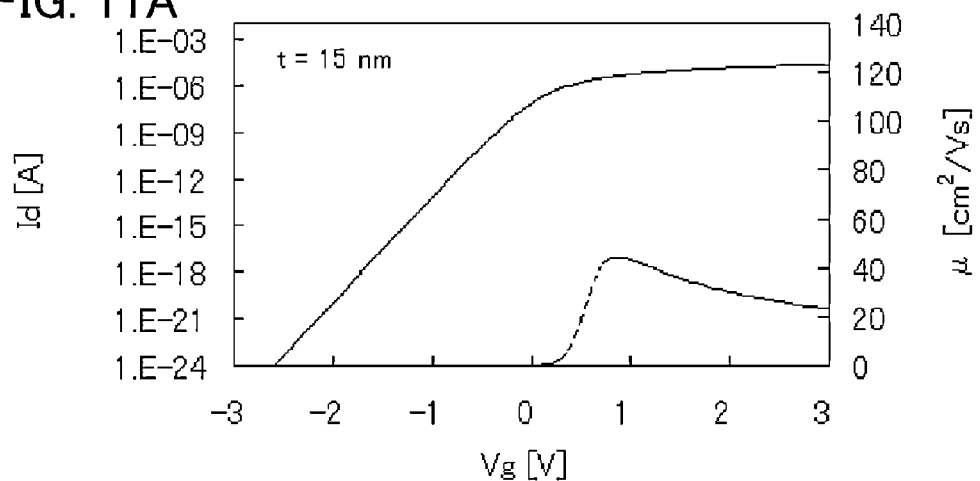
FIGS. 11A to 11C show gate voltage dependence of a drain current and mobility obtained by calculation.
Figure 11B:
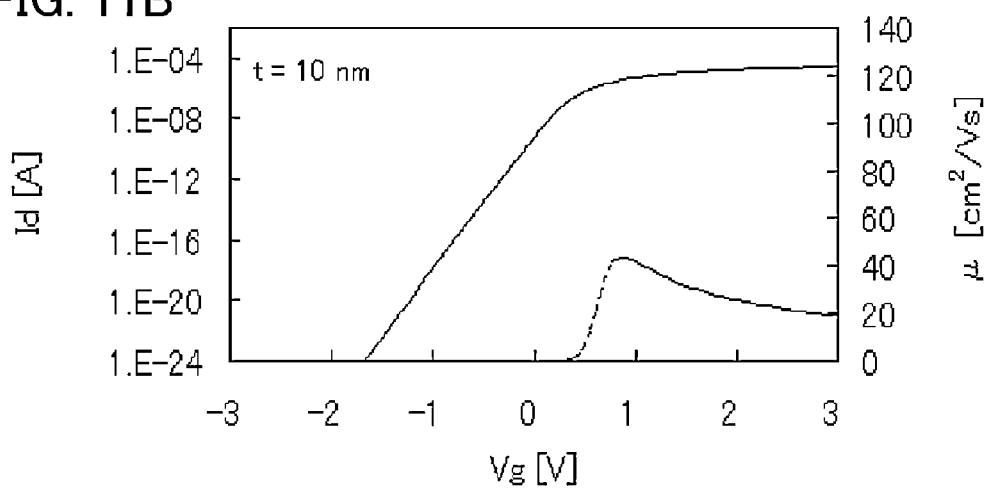
Figure 11C:
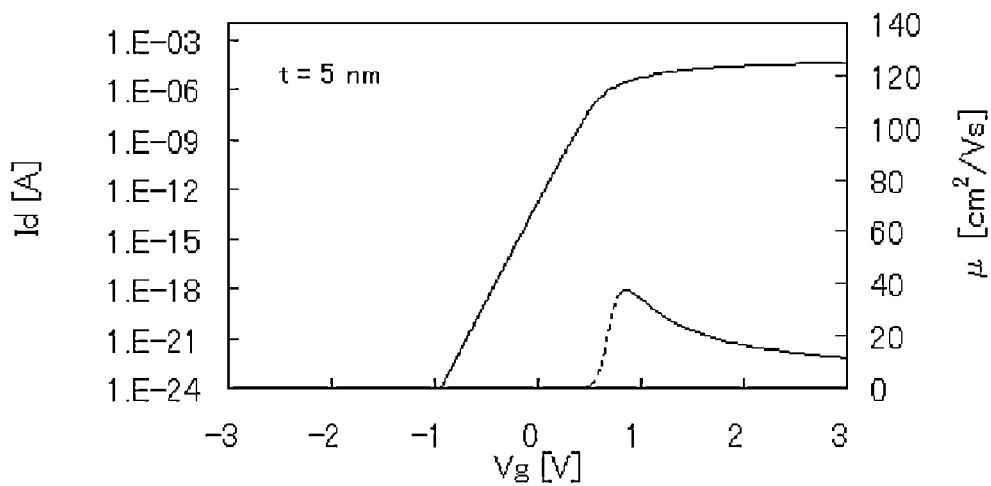

Further, FIGS. 11A to 11C show the gate voltage dependence of the drain current $I_d$ (a solid line) and the mobility μ (a dotted line) of the transistor having the structure illustrated in FIG. 12B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 11A shows the gate voltage dependence of the transistor in the case where the thickness of the gate insulating layer is 15 nm, FIG. 11B shows that of the transistor in the case where the thickness of the gate insulating layer is 10 nm, and FIG. 11C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 9A to 9C, approximately 60 cm²/Vs in FIGS. 10A to 10C, and approximately 40 cm²/Vs in FIGS. 11A to 11C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

The transistor described in this embodiment is provided between the input terminal of the voltage controlled oscillator 308 and the capacitor 322 in the loop filter 306, and the transistor is in an on state in a normal operation state and the transistor is in an off state in a stand-by state. In this manner, the phase locked loop can be in the locked state in short time after the return from a stand-by state and further power consumption can be reduced. Further, a transistor including an oxide semiconductor in a semiconductor layer (at least in a channel formation region) has sufficiently high mobility as described above, and therefore application of the transistor to the phase locked loop 300 does not cause delay in the operation state of the semiconductor device including the phase locked loop 300.

Embodiment 3

In this embodiment, when the transistor including an oxide semiconductor material containing In, Sn, or Zn as a main component in a semiconductor layer (at least in a channel formation region), which is described in Embodiment 1, is manufactured, conditions of deposition by intentional heating of a substrate and/or heat treatment after the deposition, and characteristics of the transistor after performing the heat treatment(s) under the condition are described.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off. Note that here, a main component refers to an element contained in a composition at 5 atomic % or more.

Figure 13A:
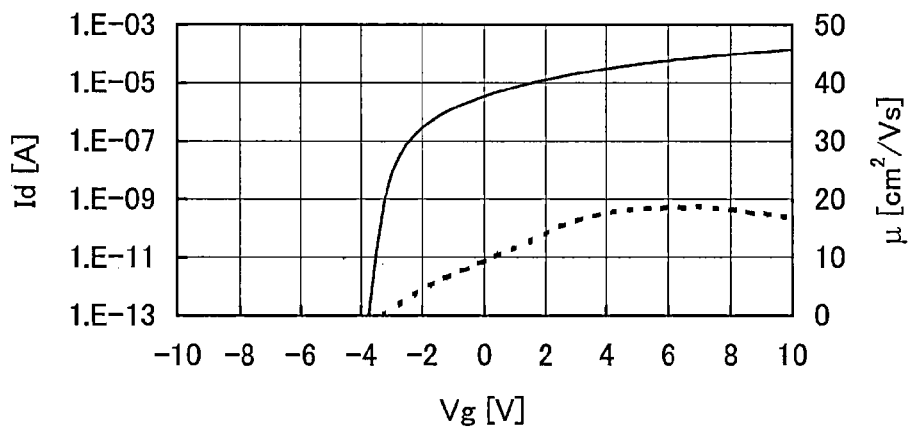
FIGS. 13A to 13C are graphs each illustrating characteristics of a transistor which includes an oxide semiconductor film containing In, Sn, and Zn as main components as a semiconductor layer.
Figure 13B:
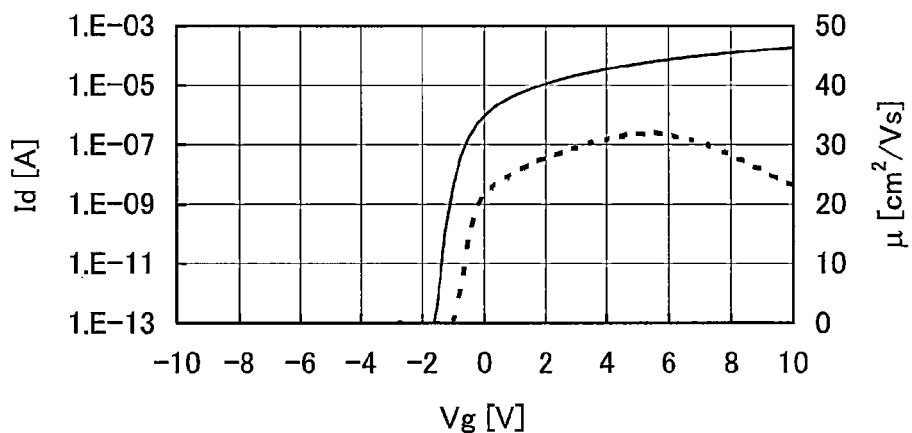
Figure 13C:
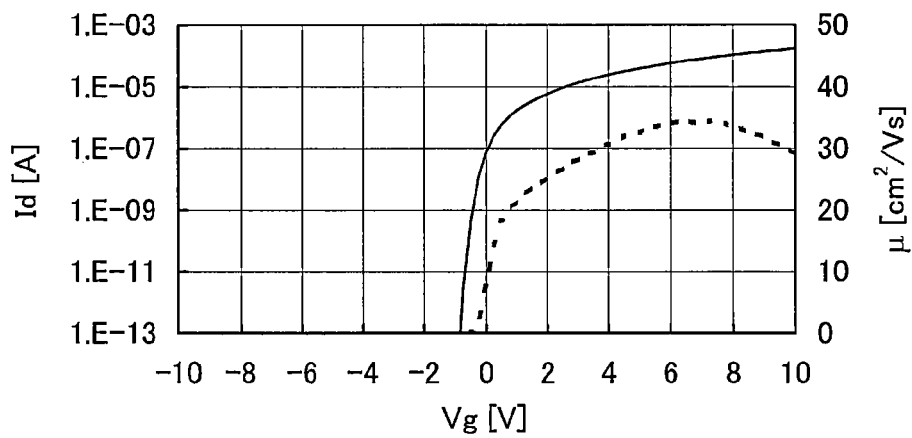

As an example, FIGS. 13A to 13C each show characteristics of a transistor in which an oxide semiconductor film including In, Sn, and Zn as main components and having a channel length L of 3 μm and a channel width W of 10 μm, and a gate insulating film with a thickness of 100 nm are used. Note that $V_d$ was set to 10 V.

FIG. 13A shows characteristics of a transistor whose oxide semiconductor film including In, Sn, and Zn as main components was formed by sputtering without heating a substrate intentionally. The field-effect mobility of the transistor is 18.8 cm²/Vsec. On the other hand, when the oxide semiconductor film including In, Sn, and Zn as main components is formed while heating the substrate intentionally, the field-effect mobility can be improved. FIG. 13B shows characteristics of a transistor whose oxide semiconductor film including In, Sn, and Zn as main components was formed while heating a substrate at 200° C. The field-effect mobility of the transistor is 32.2 cm²/Vsec.

The field-effect mobility can be further improved by performing heat treatment after formation of the oxide semiconductor film including In, Sn, and Zn as main components. FIG. 13C shows characteristics of a transistor whose oxide semiconductor film including In, Sn, and Zn as main components was formed by sputtering at 200° C. and then subjected to heat treatment at 650° C. The field-effect mobility of the transistor is 34.5 cm²/Vsec.

The intentional heating of the substrate during the formation of the oxide semiconductor film by a sputtering method is expected to have an effect of reducing hydrogen, moisture, and the like taken into the oxide semiconductor film. Further, the heat treatment after deposition enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm²/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during deposition and/or the heat treatment after the deposition contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 13A and 13B.

Note that the threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When deposition or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of 20 V was applied so that the intensity of an electric field applied to the gate insulating film was 2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a positive BT test.

In a similar manner, first, $V_g$–$I_d$ characteristics of the transistors were measured at a substrate temperature of 25° C. and $V_d$ of 10 V. Note that $V_d$ is a drain voltage (a potential difference between a drain and a source). Then, the substrate temperature was set to 150° C. and $V_d$ was set to 0.1 V. After that, $V_g$ of −20 V was applied so that the intensity of an electric field applied to the gate insulating film was −2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a negative BT test.

Figure 14A:
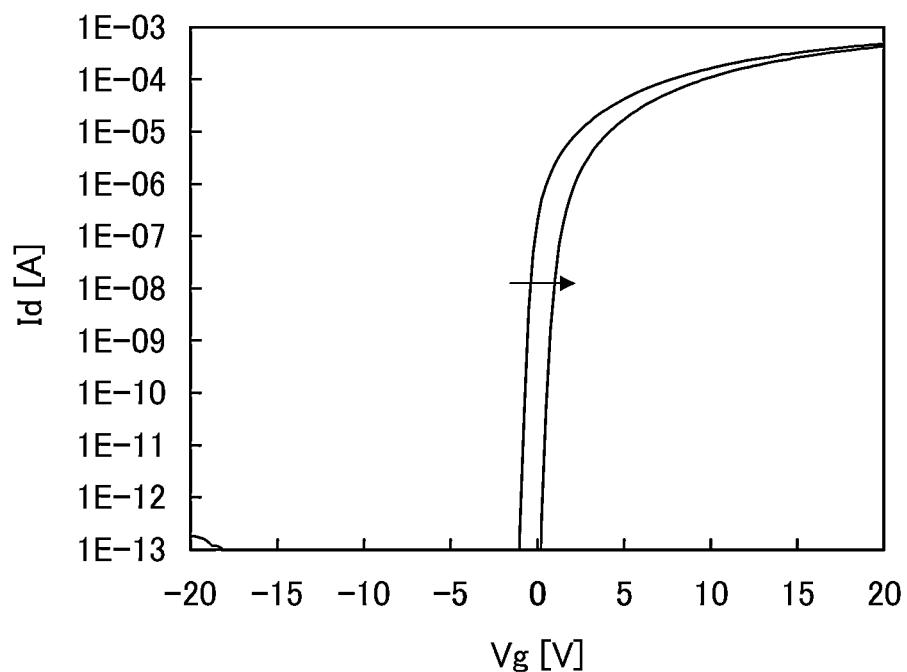
FIGS. 14A and 14B are graphs each illustrating characteristics of a transistor which has an oxide semiconductor film containing In, Sn, and Zn as main components as a semiconductor layer.
Figure 14B:
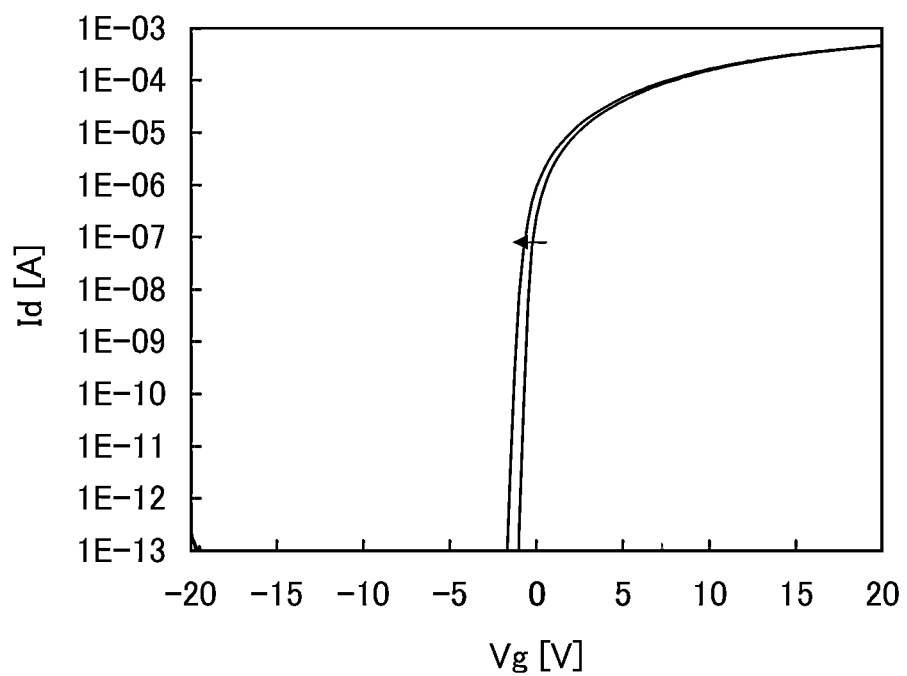
Figure 15A:
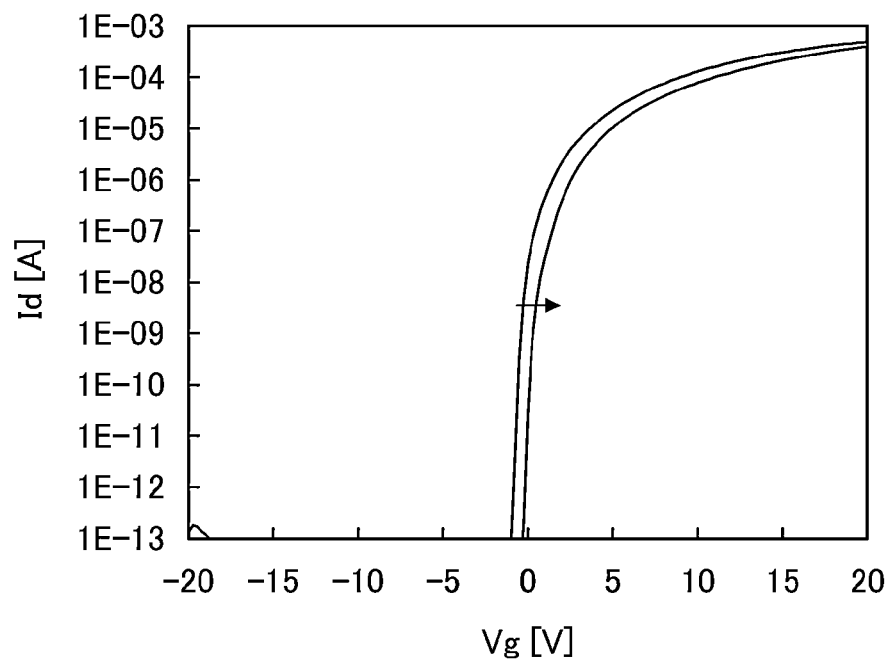
FIGS. 15A and 15B are graphs each illustrating characteristics of a transistor which includes an oxide semiconductor film containing In, Sn, and Zn as main components as a semiconductor layer.
Figure 15B:
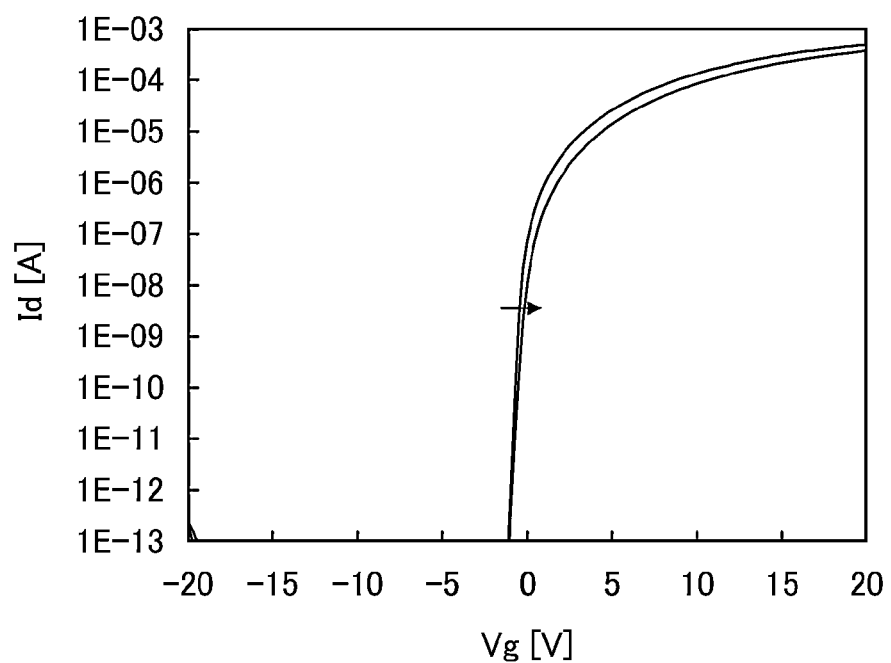

FIGS. 14A and 14B show a result of the positive BT test of Sample 1 and a result of the negative BT test of Sample 1, respectively. FIGS. 15A and 15B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed, as described in Embodiment 1.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in deposition was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 16:
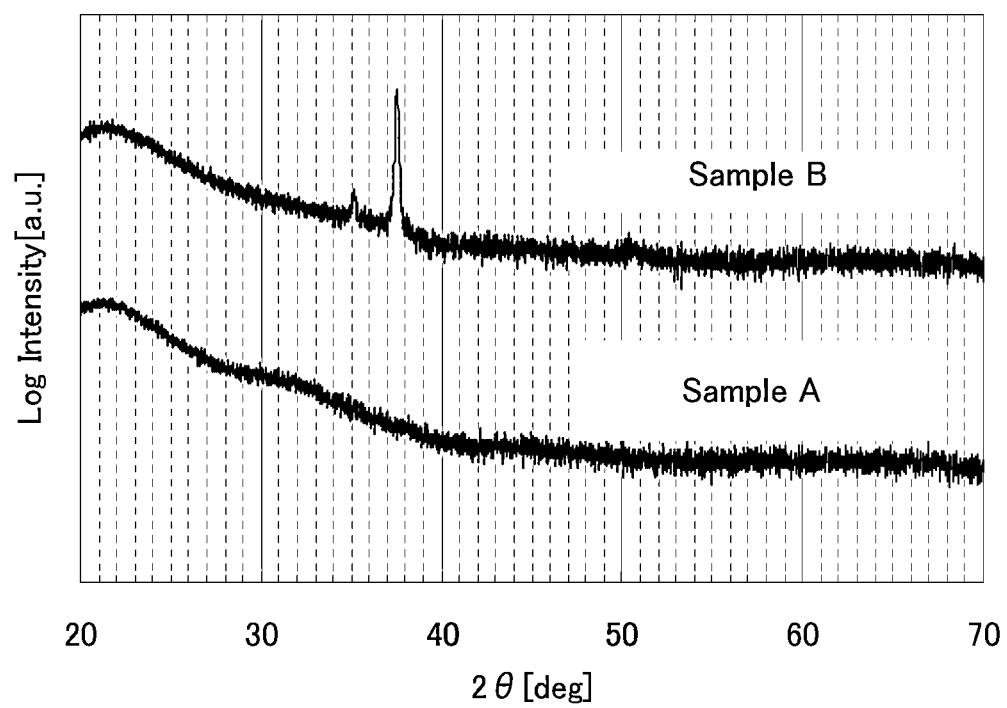
FIG. 16 is a graph showing XRD spectrum of an oxide semiconductor film containing In, Sn, and Zn as main components.

FIG. 16 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 17:
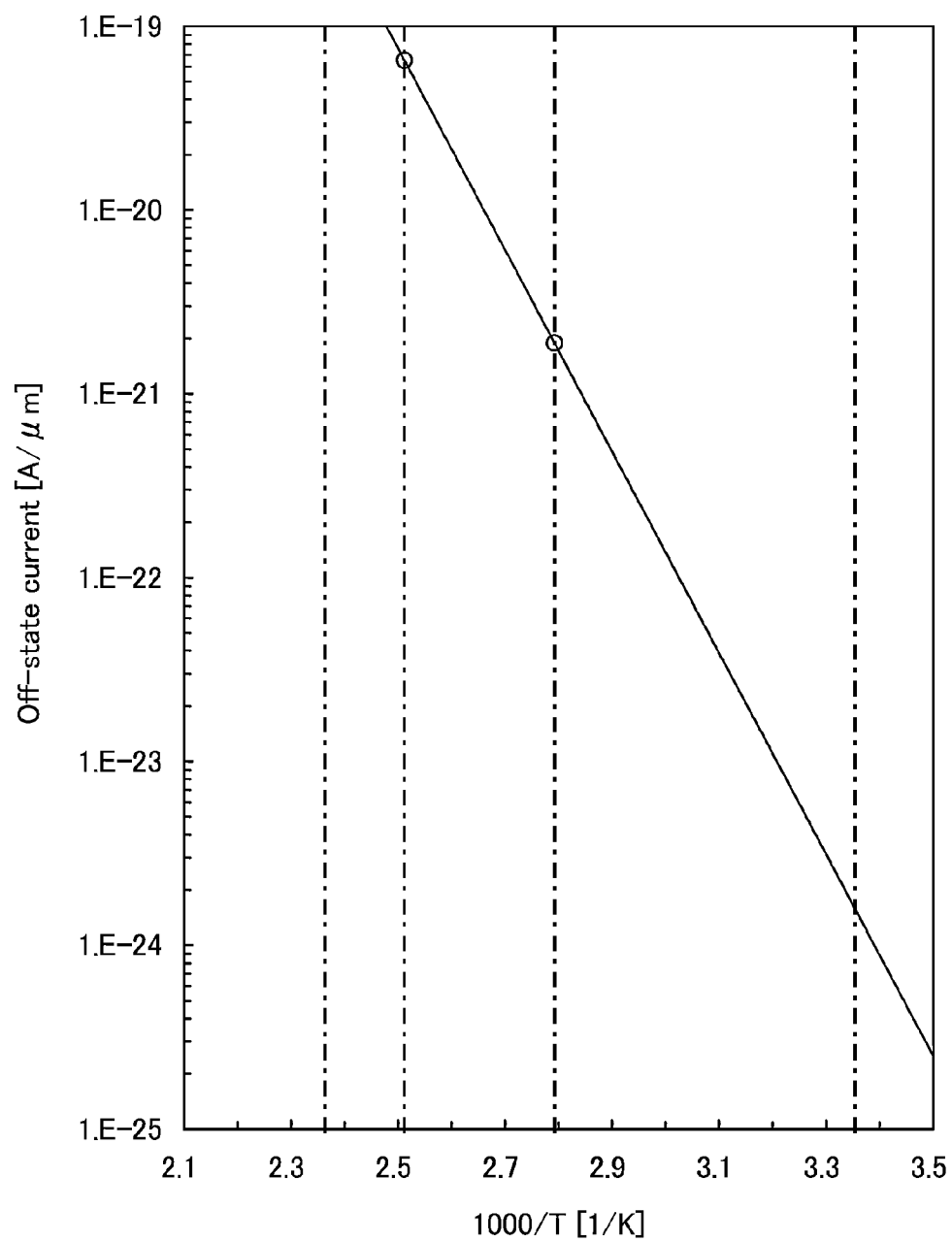
FIG. 17 shows a relation between the off-state current of a transistor which includes an oxide semiconductor film containing In, Sn, and Zn as main components as a semiconductor layer and the inverse of substrate temperature (absolute temperature) at measurement.

FIG. 17 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 17, the off-state current was 0.1 aA/μm ($1 \times 10^{-19}$ A/μm) or smaller and 10 zA/μm ($1 \times 10^{-2}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1 \times 10^{-22}$ A/μm) or smaller. Hence, the off-state current can be 1 aA/μm ($1 \times 10^{-18}$ A/μm) or smaller, 100 zA/μm ($1 \times 10^{-19}$ A/μm) or smaller, and 1 zA/μm ($1 \times 10^{-21}$ A/μm) or smaller at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently preventing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 18:
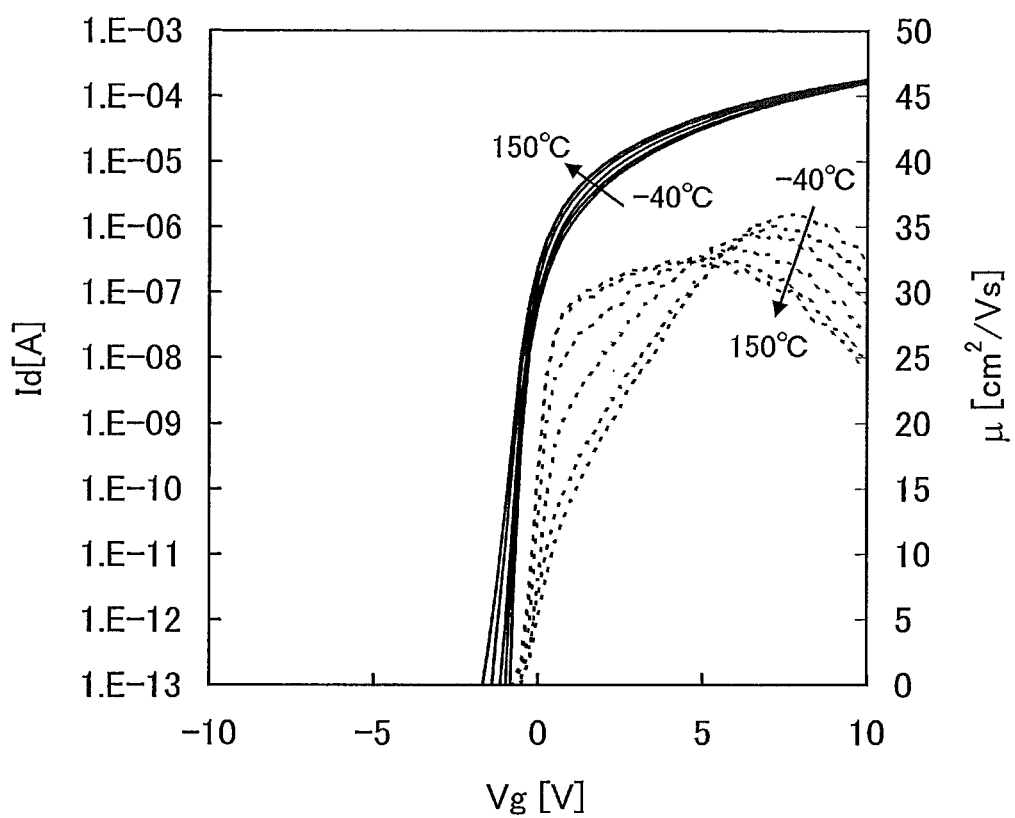
FIG. 18 shows a relation between the substrate temperature and electric characteristics of the transistor of the sample on which heat treatment at 650° C. was performed after deposition of the oxide semiconductor film.
Figure 19A:
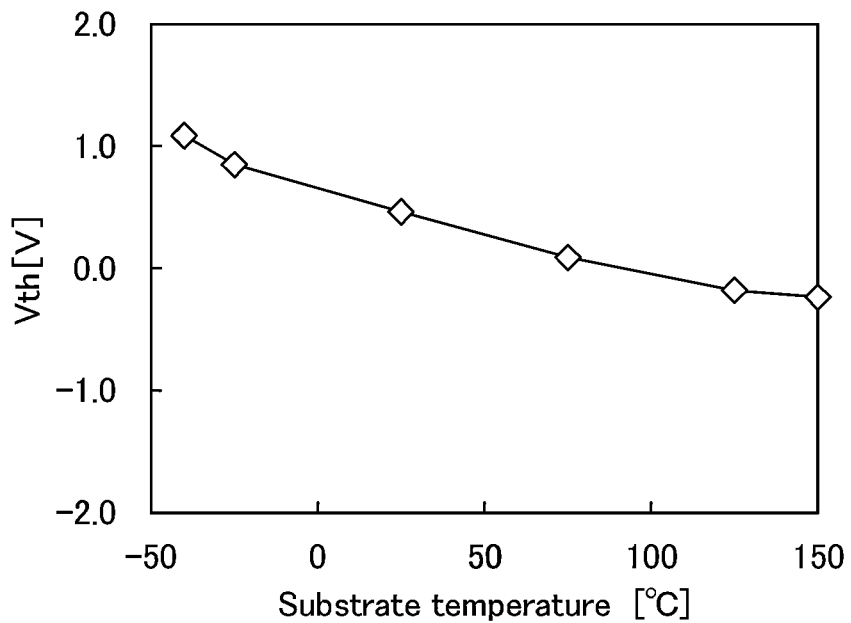
FIGS. 19A and 19B each show a relation between the substrate temperature and electric characteristics of the transistor of the sample on which heat treatment at 650° C. was performed after deposition of the oxide semiconductor film.

FIG. 18 shows the $V_g$ dependence of $I_d$ (a solid line) and field-effect mobility (a dotted line). FIG. 19A shows a relation between the substrate temperature and the threshold voltage, and FIG. 19B shows a relation between the substrate temperature and the field-effect mobility.

From FIG. 19A, it is found that the threshold voltage gets lower as the substrate temperature increases. Note that the threshold voltage is decreased from 1.09 V to −0.23 V in the range from −40° C. to 150° C.

Figure 19B:
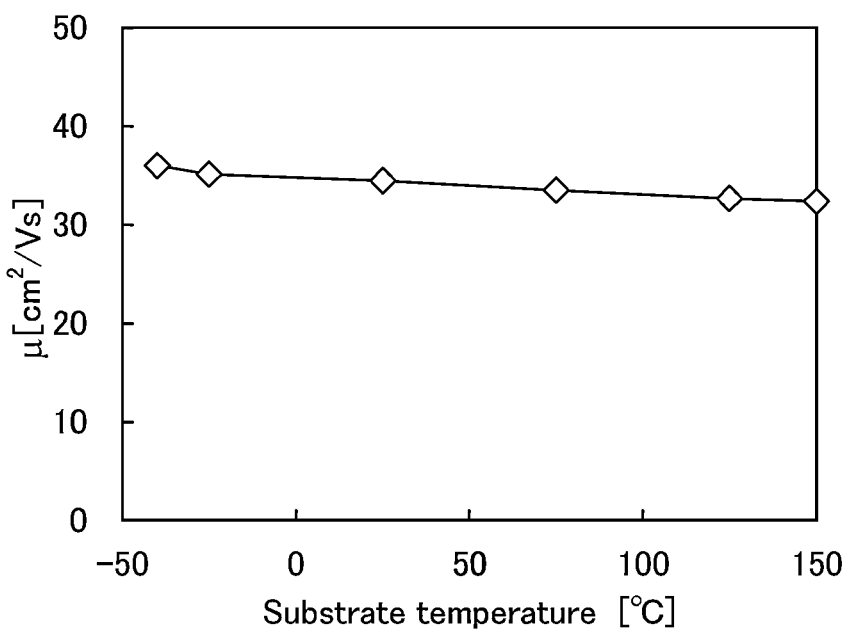

From FIG. 19B, it is found that the field-effect mobility gets lower as the substrate temperature increases. Note that the field-effect mobility is decreased from 36 cm$^2$/Vs to 32 cm$^2$/Vs in the range from −40° C. to 150° C. (see FIG. 18). Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Embodiment 4

In this embodiment, an example of a crystal structure of the CAAC-OS film described in the above embodiment is described in detail with reference to FIGS. 20A to 20E, FIGS. 21A to 21C, and FIGS. 22A to 22C. In FIGS. 20A to 20E, FIGS. 21A to 21C, and FIGS. 22A to 22C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 20A to 20E, O surrounded by a circle represents tetracoordinate O and O surrounded by a double circle represents tricoordinate O.

Figure 20A:
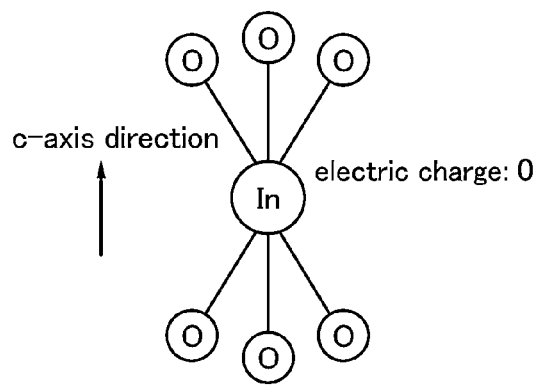
FIGS. 20A to 20E each illustrate a structure of an oxide material.

FIG. 20A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 20A is actually an octahedral structure, but is illustrated as a planar structure for simplicity. Note that three tetracoordinate O atoms exist in each of an upper half and a lower half in FIG. 20A. In the small group illustrated in FIG. 20A, electric charge is 0.

Figure 20D:
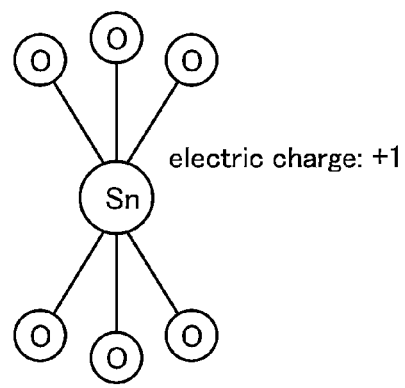
Figure 20B:
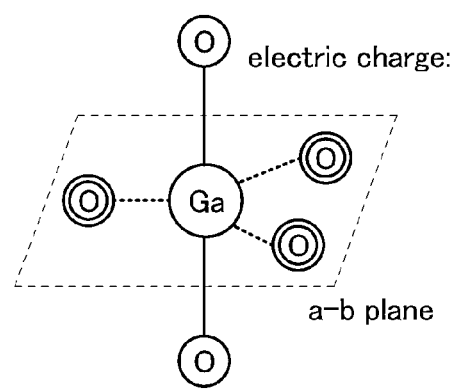

FIG. 20B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 20B. An In atom can also have the structure illustrated in FIG. 20B because an In atom can have five ligands. In the small group illustrated in FIG. 20B, electric charge is 0.

Figure 20E:
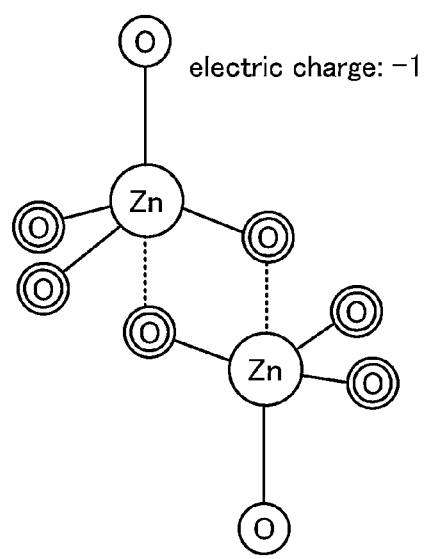
Figure 20C:
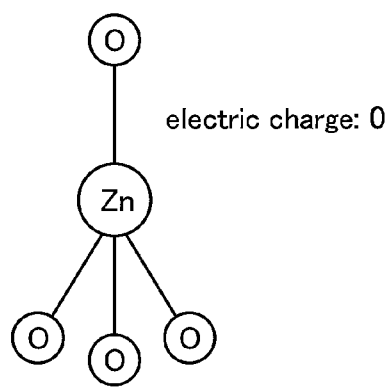

FIG. 20C illustrates a structure including one tetracoordinate Zn atom and four tetracoordinate O atoms proximate to the Zn atom. In FIG. 20C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 20C. In the small group illustrated in FIG. 20C, electric charge is 0.

FIG. 20D illustrates a structure including one hexacoordinate Sn atom and six tetracoordinate O atoms proximate to the Sn atom. In FIG. 20D, three tetracoordinate O atoms exist in each of an upper half and a lower half. In the small group illustrated in FIG. 20D, electric charge is +1.

FIG. 20E illustrates a small group including two Zn atoms. In FIG. 20E, one tetracoordinate O atom exists in each of an upper half and a lower half. In the small group illustrated in FIG. 20E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 20A each have three proximate In atoms in the downward direction, and the three O atoms in the lower half each have three proximate In atoms in the upward direction. The one O atom in the upper half with respect to the pentacoordinate Ga atom in FIG. 20B has one proximate Ga atom in the downward direction, and the one O atom in the lower half has one proximate Ga atom in the upward direction. The one O atom in the upper half with respect to the tetracoordinate Zn atom in FIG. 20C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described as follows. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 21A:
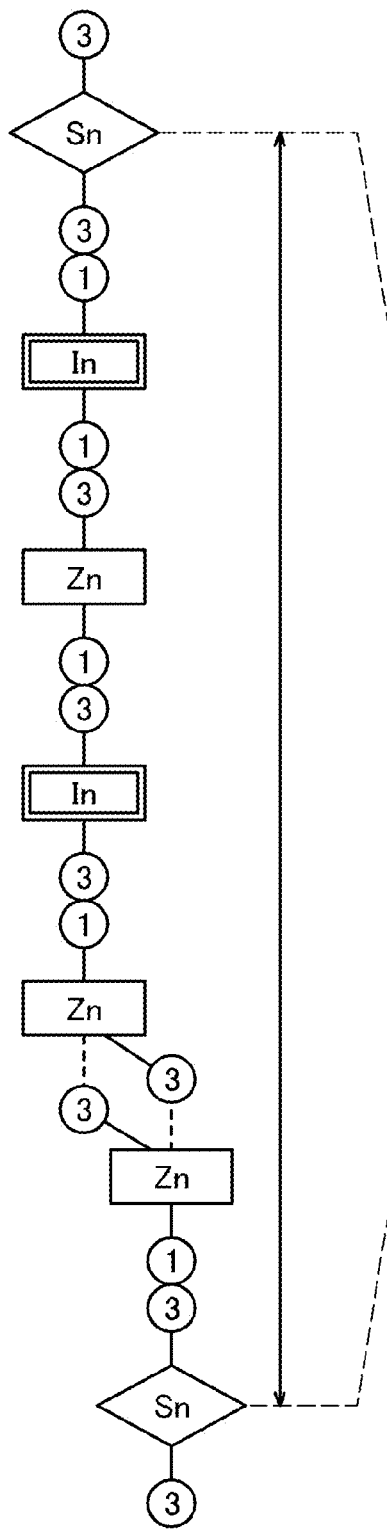
FIGS. 21A to 21C each illustrate a structure of an oxide material.
Figure 21B:
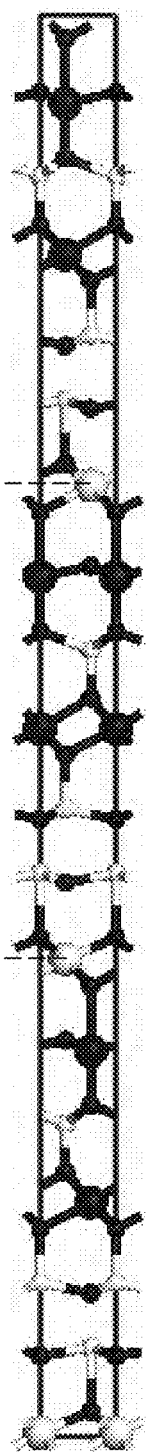
Figure 21C:
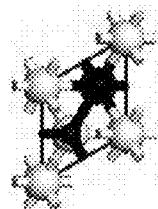

FIG. 21A illustrates a model of a medium group included in a layered structure of an In—Sn—Zn—O-based material. FIG. 21B illustrates a large group including three medium groups. Note that FIG. 21C illustrates an atomic arrangement in the case where the layered structure in FIG. 21B is observed from the c-axis direction.

In FIG. 21A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 21A, one tetracoordinate O atom existing in each of an upper half and a lower half with respect to an In atom is denoted by circled 1. FIG. 21A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 21A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 20E can be given. For example, with one small group including two Zn atoms, electric charge of one small group including a Sn atom can be cancelled, so that the total electric charge of the layered structure can be 0.

When the large group illustrated in FIG. 21B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following materials: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; a single-component metal oxide, such as an In—O-based oxide, a Sn—O-based oxide, or a Zn—O-based oxide; and the like.

As an example, FIG. 22A illustrates a model of a medium group included in a layered structure of an In—Ga—Zn—O-based material.

In the medium group included in the layered structure of the In—Ga—Zn—O-based material in FIG. 22A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 22B illustrates a large group including three medium groups. Note that FIG. 22C illustrates an atomic arrangement in the case where the layered structure in FIG. 22B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 22A but also a medium group in which the arrangement of the In atom, the Ga atom, and the Zn atom is different from that in FIG. 22A.

When the large group shown in FIG. 22B is repeated, a crystal of an In—Ga—Zn—O system can be obtained. Note that a layered structure of the obtained In—Ga—Zn—O-based crystal can be expressed as a composition formula, $InGaO_3(ZnO)_n$ (n is a natural number).

Figure 23A:
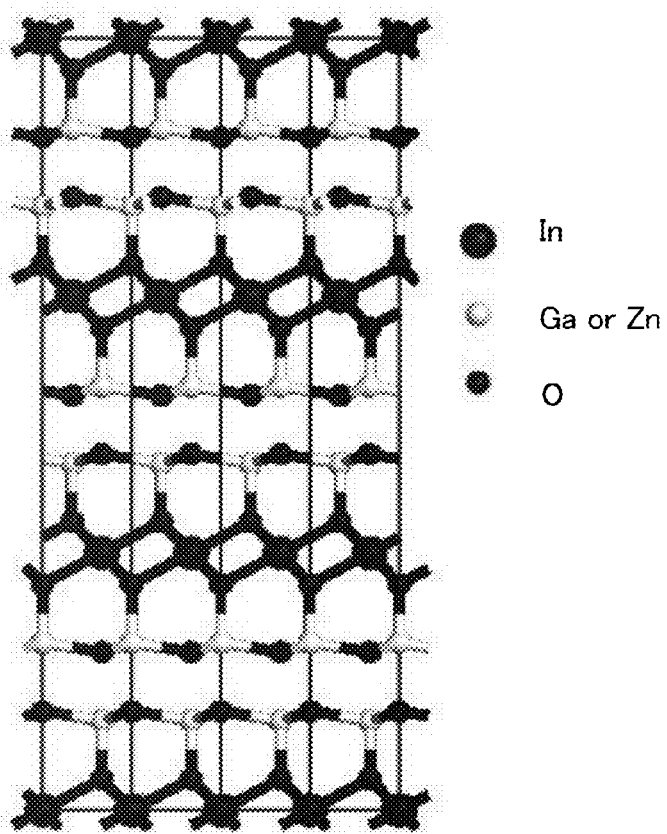
FIGS. 23A and 23B each illustrate a crystal structure of an oxide material.

In the case where n=1 ($InGaZnO_4$), a crystal structure illustrated in FIG. 23A can be obtained, for example. Note that in the crystal structure in FIG. 23A, a Ga atom and an In atom each have five ligands as described in FIG. 21B, a structure in which Ga is replaced with In can be obtained.

Figure 23B:
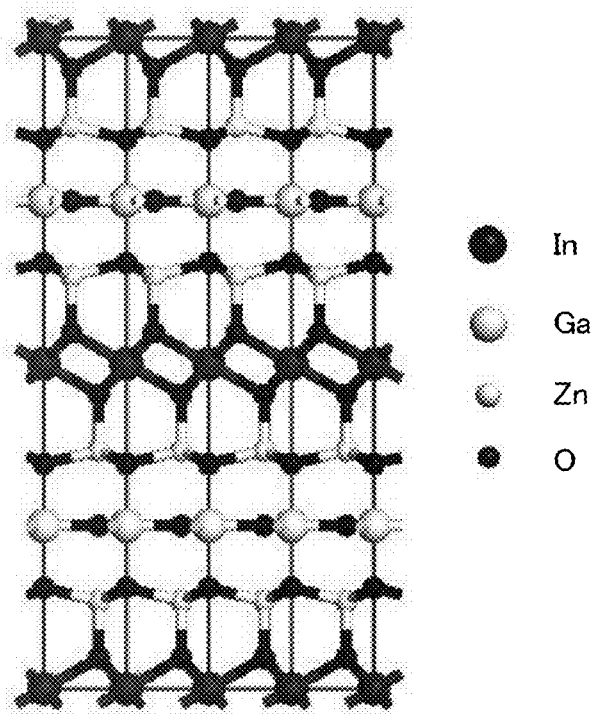

In the case where n is 2 ($InGaZn_2O_5$), a crystal structure illustrated in FIG. 23B can be obtained, for example. Note that in the crystal structure in FIG. 23B, since a Ga atom and an In atom each have five ligands as described in FIG. 21B, a structure in which Ga is replaced with In can be obtained.

The above is a description of an oxide including a crystal with c-axis alignment (also referred to as c-axis aligned crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

Embodiment 5

In this embodiment, the case where the phase locked loop described in the above embodiments is applied to a semiconductor device is described with reference to FIGS. 24A and 24B. Note that in drawings, the same portions as those in the drawings in any of the above embodiments are denoted by the same reference numerals, and the description thereof is omitted. Here, an FM demodulator and a motor controller are described as examples of a semiconductor device. Needless to say, the semiconductor device is not limited thereto.

Figure 24A:
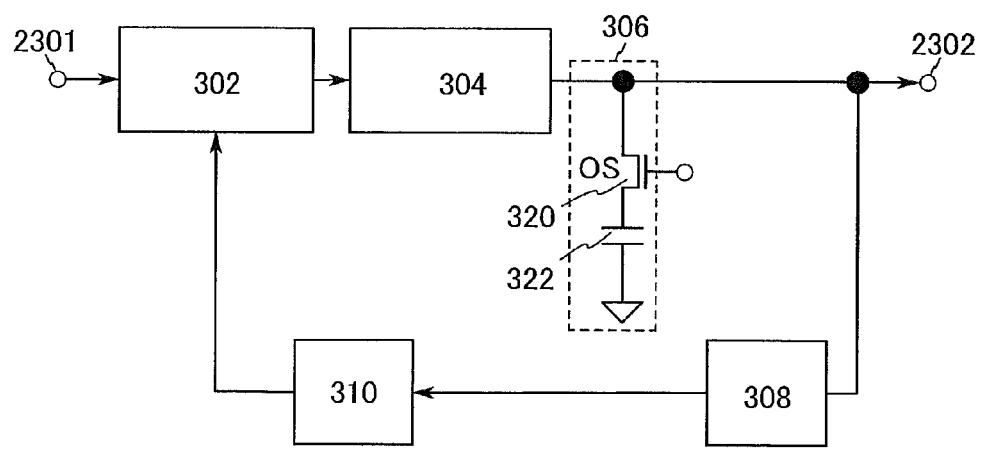
FIGS. 24A and 24B each illustrate a semiconductor device provided with a phase locked loop according to one embodiment of the present invention.

As an example, FIG. 24A shows a block diagram of an FM demodulator including the phase locked loop described in the above embodiments in which the loop filter 306 has the OS transistor 320. The FM demodulator is provided with an input terminal 2301, an output terminal 2302, the phase frequency detector 302, the charge pump 304, the loop filter 306, the voltage controlled oscillator 308, and the frequency divider 310 (a frequency dividing rate is normally 1). The loop filter 306 includes the OS transistor 320 and the capacitor 322. Note that the frequency divider 310 does not have to be provided.

In the FM demodulator with a configuration in FIG. 24A, an FM modulating signal is input to the input terminal 2301, and an output from the loop filter 306 is output as an FM demodulating signal (a signal formed in such a manner that the FM modulating signal is converted into a signal corresponding to change in frequency and then the signal is demodulated). When the FM demodulator is in a locked state, output of the voltage controlled oscillator 308 is synchronized with the FM modulating signal input from the input terminal 2301; accordingly, a voltage signal corresponding to the change in frequency is output from the output terminal 2302.

The phase locked loop described in the above embodiments is applied to the FM demodulator, so that time until FM demodulation can be performed after a return from a stand-by state can be shorten. As the result, the power consumption can be reduced.

Figure 24B:
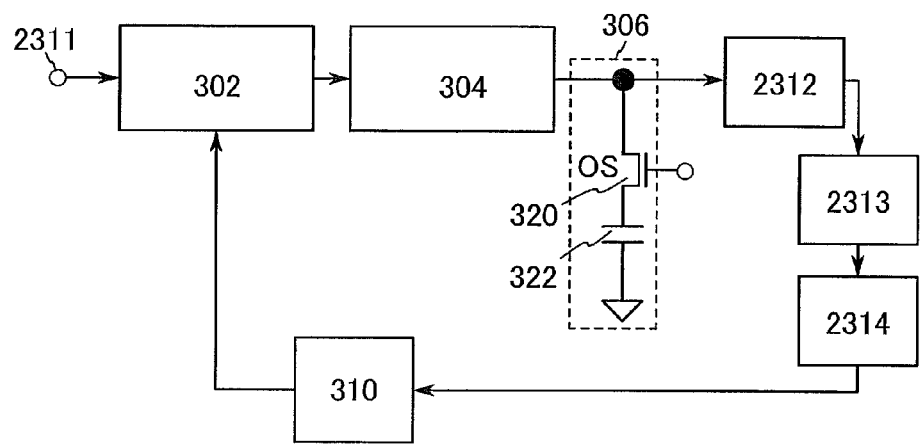

As an example, FIG. 24B shows a block diagram of a motor controller including the phase locked loop described in the above embodiments in which the loop filter 306 has the OS transistor 320. The motor controller includes an input terminal 2311, the phase frequency detector 302, the charge pump 304, the loop filter 306 including the OS transistor 320 and the capacitor 322, the frequency divider 310, a driver circuit 2312, a motor 2313, and an optical encoder 2314. Note that the driver circuit 2312, the motor 2313, and the optical encoder 2314 collectively correspond to the voltage controlled oscillator 308.

A reference periodic signal input from the input terminal 2311 is input to the phase frequency detector 302 and its phase is compared to that of a signal output from the frequency divider 310. Then, a phase difference signal is output from the phase frequency detector 302. The phase difference signal is converted into a voltage signal by the charge pump 304 and the loop filter 306 and the voltage signal is input to the driver circuit 2312. The driver circuit 2312 outputs a signal determining the revolutions per minute (RPM) of the motor 2313 in accordance with the inputted voltage signal. Further, the RPM of the motor 2313 is detected by the optical encoder 2314. Then, a periodic signal corresponding to the RPM is output from the optical encoder 2314, and the periodic signal is divided by the frequency divider 310 and input to the phase frequency detector 302. That is, the circuit can accurately control the RPM of a motor with the use of the frequency of a reference periodic signal input from the input terminal 2311.

The phase locked loop described in the above embodiments is applied to the motor controller, so that time until the RPM of a motor is stabilized after a return from a stand-by state can be shorten. As the results, power consumption can be reduced.

This application is based on Japanese Patent Application serial no. 2011-113497 filed with Japan Patent Office on May 20, 2011, the entire contents of which are hereby incorporated by reference.

What is claimed is:

1. A driving method of a semiconductor device including a voltage controlled oscillator and a loop filter which includes a transistor and a capacitor electrically connected to the transistor, the driving method comprising the steps of:

inputting a potential to the loop filter; and
turning off the transistor when a cycle of a periodic signal output from the voltage controlled oscillator is constant so that the capacitor holds the potential,
wherein a channel formation region of the transistor comprises an oxide semiconductor material.

2. The driving method according to claim 1, wherein the oxide semiconductor material comprises one or more of elements selected from In, Ga, Sn, and Zn.

3. The driving method according to claim 1, wherein the transistor comprises an oxide semiconductor layer comprising the channel formation region, a gate insulating layer over the oxide semiconductor layer, and a gate electrode over the oxide semiconductor layer with the gate insulating layer interposed therebetween.

4. The driving method according to claim 3, wherein the oxide semiconductor layer is a c-axis aligned crystalline oxide semiconductor layer.

5. A driving method of a semiconductor device including a phase locked loop including a loop filter which includes a transistor and a capacitor electrically connected to the transistor, the driving method comprising the steps of:

inputting a potential to the loop filter;
turning off the transistor so that the capacitor holds the potential and the phase locked loop becomes a stand-by state; and
turning on the transistor so that the phase locked loop is returned from the stand-by state,
wherein a channel formation region of the transistor comprises an oxide semiconductor material,
wherein the phase locked loop includes a voltage controlled oscillator, and
wherein the transistor is turned off when a cycle of a periodic signal output from the voltage controlled oscillator is constant.

6. The driving method according to claim 5, further comprising the step of inputting the potential held in the capacitor to the voltage controlled oscillator.

7. The driving method according to claim 5, wherein the oxide semiconductor material comprises one or more of elements selected from In, Ga, Sn, and Zn.

8. The driving method according to claim 5, wherein the transistor comprises an oxide semiconductor layer comprising the channel formation region, a gate insulating layer over the oxide semiconductor layer, and a gate electrode over the oxide semiconductor layer with the gate insulating layer interposed therebetween.

9. The driving method according to claim 8, wherein the oxide semiconductor layer is a c-axis aligned crystalline oxide semiconductor layer.

10. A driving method of a semiconductor device including a phase locked loop, the driving method comprising the steps of:

converting a phase difference between two periodic signals into a first periodic signal by a phase frequency detector and outputting the first periodic signal into a charge pump;
converting the first periodic signal into a current signal by the charge pump and outputting the current signal into a loop filter including a transistor;
converting the current signal into a voltage signal by the loop filter and outputting the voltage signal into a voltage controlled oscillator; and
outputting a second periodic signal from the voltage controlled oscillator wherein the second periodic signal is a signal in accordance with the voltage signal,
wherein the transistor is configured to be turned off when a cycle of the second periodic signal is constant, and
wherein a channel formation region of the transistor comprises an oxide semiconductor material.

11. The driving method according to claim 10,
wherein the loop filter further comprises a capacitor electrically connected to the transistor,
wherein the capacitor holds a potential at the time of turning off the transistor,
wherein one of a source electrode and a drain electrode of the transistor is electrically connected to the charge pump and the voltage controlled oscillator, and
wherein the other of the source electrode and the drain electrode of the transistor is electrically connected to the capacitor.

12. The driving method according to claim 10,
wherein the phase locked loop is configured to become a stand-by state after the transistor is turned off, and
wherein the phase locked loop is configured to be returned from the stand-by state after the transistor is turned on.

13. The driving method according to claim 10, further comprising the step of dividing the second periodic signal by a frequency divider and outputting a third periodic signal into the phase frequency detector.

14. The driving method according to claim 10, wherein the oxide semiconductor material comprises one or more of elements selected from In, Ga, Sn, and Zn.

15. The driving method according to claim 10, wherein one of the two periodic signals is formed by dividing the second periodic signal.

16. The driving method according to claim 10, wherein the second periodic signal is output by the voltage controlled oscillator to an output terminal.

17. The driving method according to claim 10, wherein the transistor comprises an oxide semiconductor layer comprising the channel formation region, a gate insulating layer over the oxide semiconductor layer, and a gate electrode over the oxide semiconductor layer with the gate insulating layer interposed therebetween.

18. The driving method according to claim 17, wherein the oxide semiconductor layer is a c-axis aligned crystalline oxide semiconductor layer.

* * * * *